(12) United States Patent
Nagano et al.

(10) Patent No.: US 6,717,106 B2
(45) Date of Patent: Apr. 6, 2004

(54) LASER SINTERING APPARATUS

(75) Inventors: Kazuhiko Nagano, Kanagawa (JP); Yoji Okazaki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 29 days.

(21) Appl. No.: 10/236,930

(22) Filed: Sep. 9, 2002

(65) Prior Publication Data

US 2003/0052105 A1 Mar. 20, 2003

(30) Foreign Application Priority Data

Sep. 10, 2001 (JP) ........................................ 2001-274351

(51) Int. Cl.⁷ ............................................. B23K 26/02
(52) U.S. Cl. .............................. 219/121.83; 219/121.65
(58) Field of Search ........................ 219/121.83, 121.65, 219/121.63, 121.6

(56) References Cited

U.S. PATENT DOCUMENTS

| | | | | |
|---|---|---|---|---|
| 5,135,695 A | * | 8/1992 | Marcus | 264/141 |
| 5,311,360 A | | 5/1994 | Bloom et al. | |
| 5,354,414 A | * | 10/1994 | Feygin | 216/34 |
| 5,430,666 A | * | 7/1995 | DeAngelis et al. | 250/491.1 |
| 6,215,093 B1 | * | 4/2001 | Meiners et al. | 219/121.61 |
| 6,526,327 B2 | * | 2/2003 | Kar et al. | 700/119 |

FOREIGN PATENT DOCUMENTS

JP 11-138645 5/1999

OTHER PUBLICATIONS

Maruya, Yoji. 1992. Hikari zokei shisutemu no kiso, genjou, mondaiten. (Foundation, status quo, and issues in optical molding systems technology.) Kata Gijutsu (Die and Mold Technology) 7, No. 10:18–23.

* cited by examiner

Primary Examiner—M. Alexandra Elve
(74) Attorney, Agent, or Firm—Sughrue Mion, PLLC

(57) ABSTRACT

A laser sintering apparatus for realizing high-speed and high-precision forming. When a first position of an exposure unit is decided by an XY-positioning mechanism, a micromirror of a DMD is turned on and off in accordance with image data in a region corresponding to the first position and a laser beam in a predetermined region including ultraviolet is supplied to the DMD and modulated for each pixel in accordance with image data. A laser beam reflected in the direction of a reflection mirror is reflected therefrom in the direction of a surface of a powdered body. A region having a predetermined area on the surface of the powdered body is exposed by the laser beam, and the exposed portion is thereby cured. Similarly, by repeating movement of and exposure with the exposure unit, the entire surface of the powdered body is exposed.

31 Claims, 25 Drawing Sheets

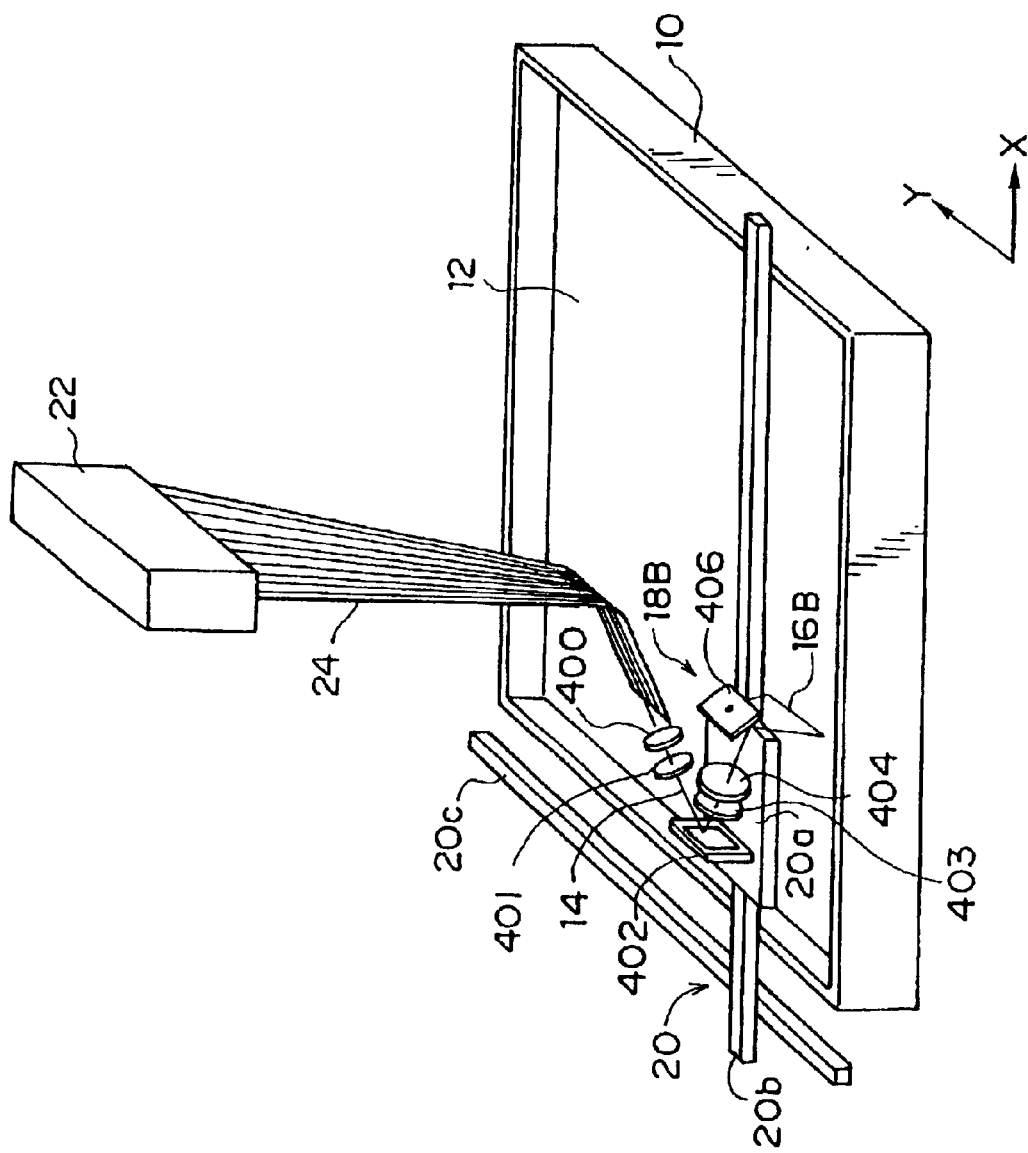

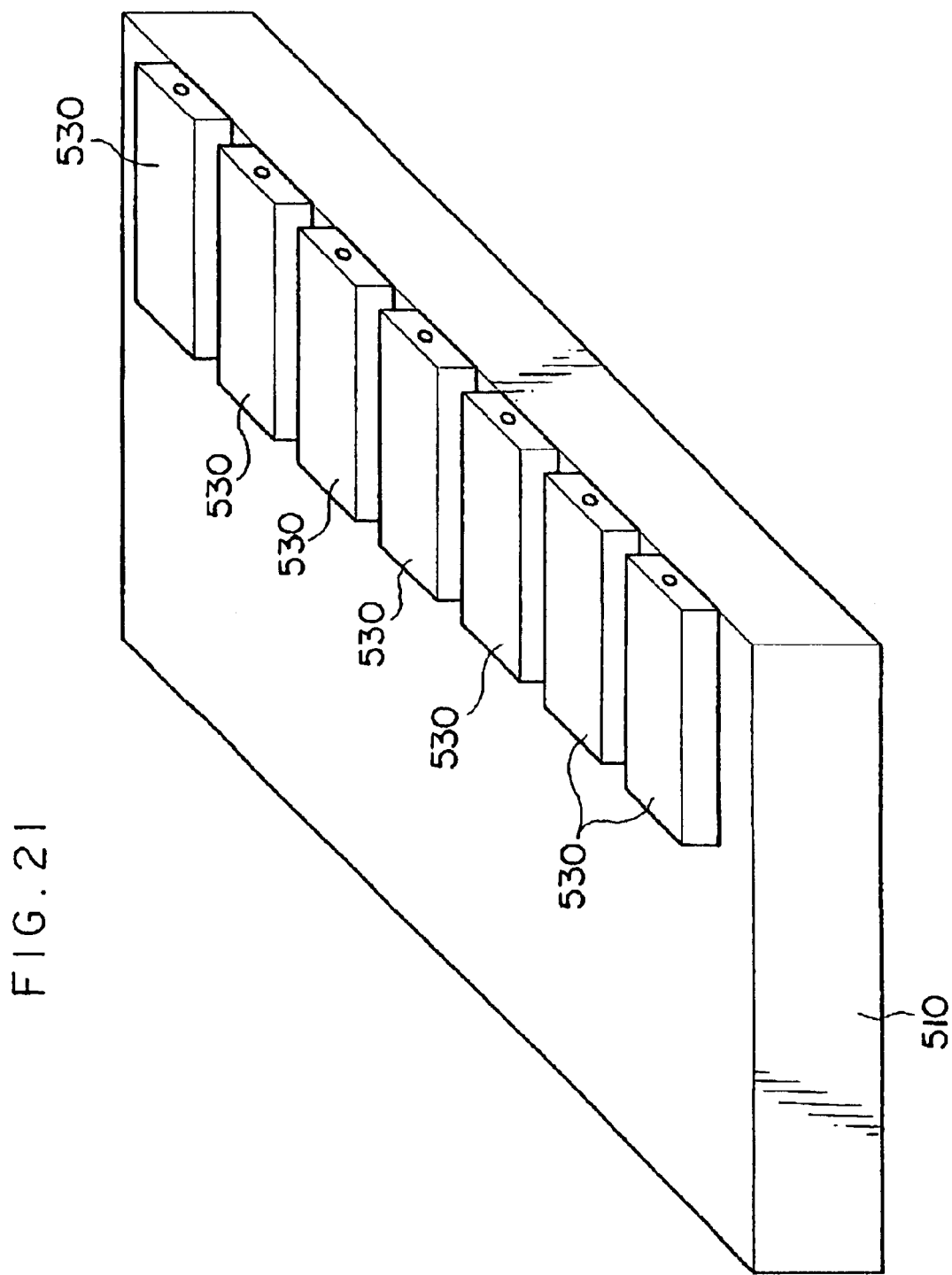

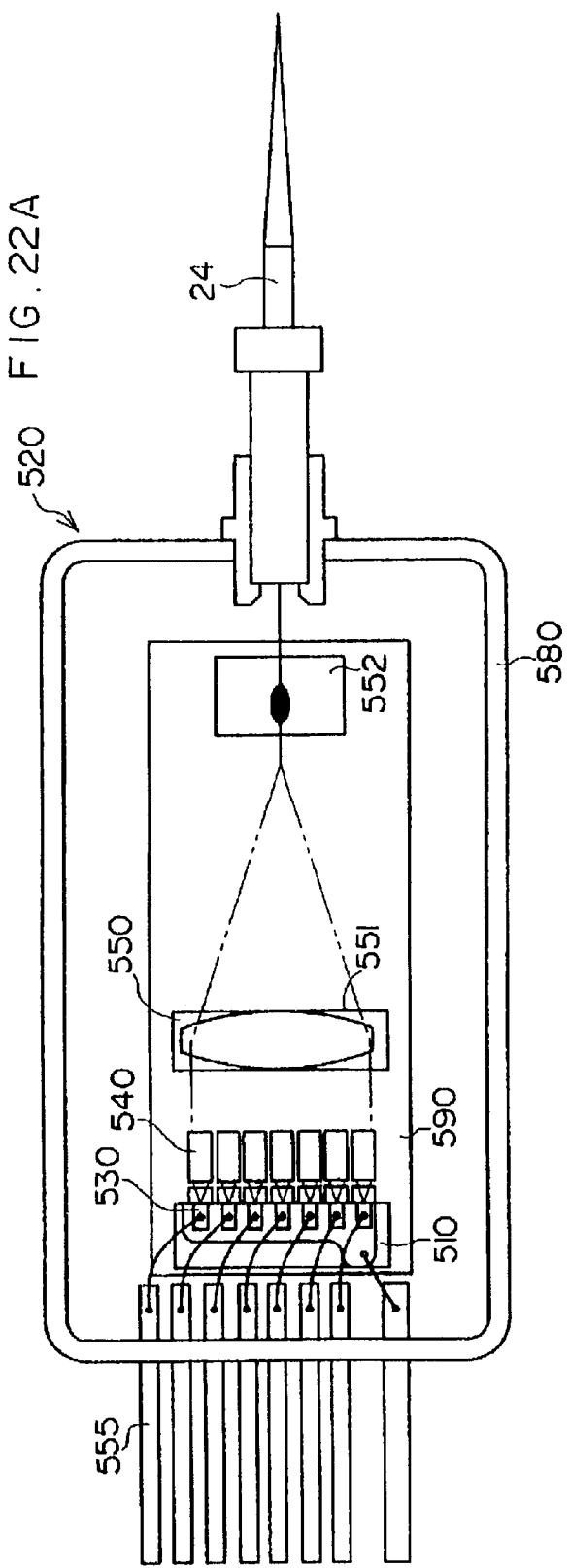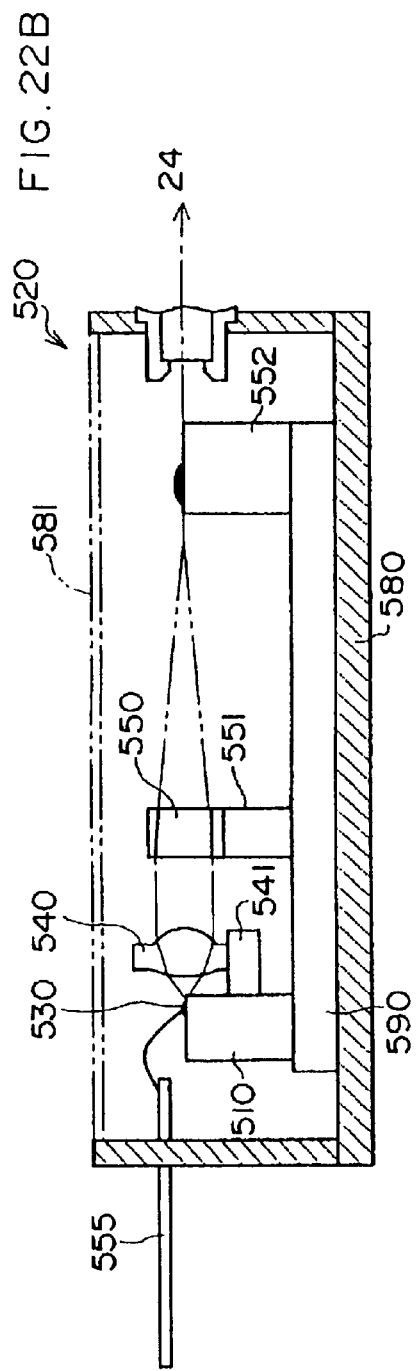

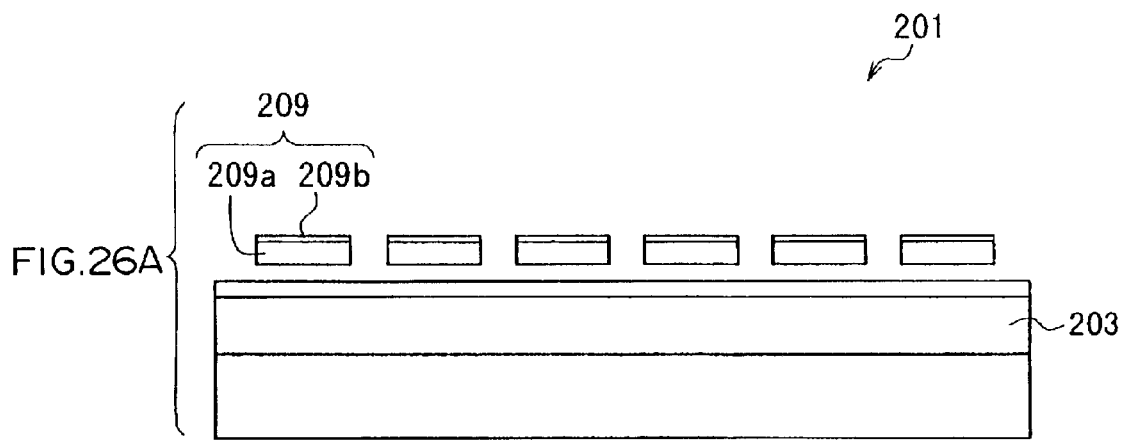
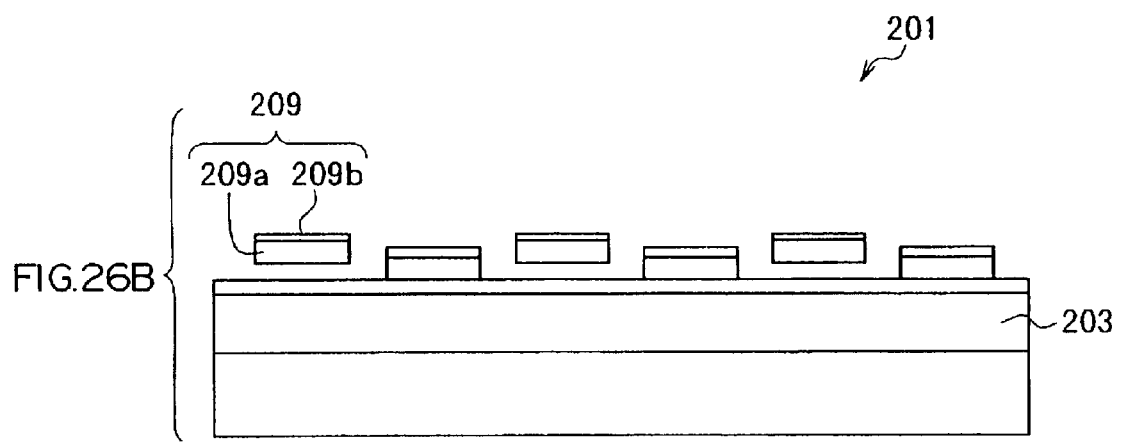

LASER SINTERING APPARATUS

BACKGROUND OF THE INVENTION

1. Field of the Invention

The present invention relates to a laser sintering apparatus, and particularly to a laser sintering apparatus for forming a three-dimensional model comprising a powder sintered body obtained by exposing a powdered body with a continuously-driven or pulse-driven laser beam in a predetermined-wavelength region that includes ultraviolet and sintering the powdered body.

2. Description of the Related Art

As three-dimensional CAD (Computer Aided Design) systems have recently spread, rapid prototyping systems for forming three-dimensional models in accordance with three-dimensional CAD data generated in virtual space within computers have been used.

Among rapid prototyping systems, an optical forming system was developed and spread in the beginning. In the case of the optical forming system, a three-dimensional model is formed by slicing CAD data at predetermined intervals on a computer to generate a plurality of sets of cross-sectional data, scanning the surface of a liquid photo-curable resin with a laser beam in accordance with the sets of cross-sectional data to cure the resin into layers, and successively laminating the layers of cured resin. As an optical forming method, a free-liquid-level method is widely known in which liquid photo-curable resin is stored in an open-top vessel and layers of cured resin are laminated while a forming table, disposed near the surface of the liquid photo-curable resin, is caused to successively sink from the surface of the resin.

Conventionally, optical forming apparatuses used in the optical forming system have included an apparatus for performing scanning with a laser plotter system and an apparatus for performing scanning with a movable mirror system, as described in an issue titled, Maruya, Yoji. 1992. Hikari zokei shisutemu no kiso, genjou, mondaiten. (Foundation, status quo, and issues in optical molding systems technology.) Kata Gijutsu (Die and Mold Technology)7, no.10:18–23.

FIG. 18 shows an optical forming apparatus according to the laser plotter system. In this apparatus, a laser beam emitted from a laser beam source 250 reaches an XY plotter 256 through an optical fiber 254 provided with a shutter 252 and is irradiated to a surface 266 of a liquid photo-curable resin 262 in a vessel 260 from the XY plotter 256. Furthermore, X- and Y-directional positions of the XY plotter 256 are controlled by a XY-positioning mechanism 258 provided with an X-positioning mechanism 258a and a Y-positioning mechanism 258b. Therefore, it is possible to cure the photo-curable resin 262 at predetermined positions of the surface 266 by turning a laser beam, irradiated from the XY plotter 256, on and off using the shutter 252 while moving the XY plotter 256 in the X and Y directions.

However, a forming apparatus according to the laser plotter system has a problem in that a shutter speed and a plotter moving speed are limited, and forming requires a long time.

FIG. 19 shows an optical forming apparatus according to the movable mirror system using a conventional galvanometer mirror. In this apparatus, a laser beam 270 is reflected from an X-axis rotation mirror 272 and a Y-axis rotation mirror 274 and irradiated to the photo-curable resin 262. The X-axis rotation mirror 272 controls an X-directional irradiation position by rotating about a Z-axis and the Y-axis rotation mirror 274 controls a Y-directional irradiation position by rotating about the X-axis. In the case of the movable mirror system, it is possible to increase a scanning speed compared to the case of the layer plotter system.

However, even in the case of the optical forming apparatus according to the movable mirror system, it takes 8 to 24 hours to form a three dimensional model of about 10 cm$^3$, even when performing high-speed scanning at a rate of, for example, 2 to 12 m/s, because scanning is performed with a very small laser spot. Therefore, forming requires a long time. Moreover, the irradiation region of the laser beam 270 is limited because the laser beam 270 is reflected only when it is incident upon the Y-axis rotation mirror 274 at an angle within a predetermined range. Further, when the Y-axis rotation mirror 274 is disposed at a high position further away from the photo-curable resin 262 in order to widen an irradiation region, problems occur in that the diameter of a laser spot increases and, positioning accuracy and forming accuracy are thereby deteriorated. Positioning accuracy is also deteriorated if a rotation angle of the Y-axis rotation mirror 274 is increased, and the number of pincushion errors increases even though an irradiation range is increased. Moreover, an optical forming apparatus using a galvanometer mirror has problems in that adjustment of an optical system, such as adjustment of an optical axis and correction of distortion, is complex and a size of the apparatus is increased because the optical system thereof is complex.

Furthermore, regardless of the system used in an optical forming apparatus, a high-output ultraviolet laser-beam source is used as a laser-beam source, and a gas laser, such as an argon laser, has generally been used so far. Maintenance of gas lasers, however, such as injection of gas, is troublesome, and moreover, gas lasers are expensive. Therefore, when a gas laser is used, the price of an optical forming apparatus is raised, and the apparatus is increased in size because accessories including a cooling chiller are necessary. In view of this problem, Japanese Patent Application Laid-open (JP-A) No. 11-138645 discloses an optical forming apparatus provided with a plurality of light sources, each capable of irradiating an exposure region with a spot larger than a single pixel in order to conduct multiple exposure of pixels using the plurality of light sources. This apparatus can use inexpensive light-emitting diodes (LED) as the light sources because multiple exposure of pixels is carried out by the plurality of light sources, and it is unnecessary to use light sources that each have a large output.

The optical forming apparatus disclosed in JP-A No. 11-138645 has problems in that it cannot be used for highly detailed forming because the spot size of each light source is larger than a single pixel, many unnecessary operations are performed because multiple exposure of pixels is carried out with the plurality of light sources, and forming requires a long time. Also, the optical forming apparatus has problems in that a size of an exposure portion is increased due to increasing the number of the light sources. Moreover, even when multiple exposure of pixels is carried out with the luminous energy outputted by the LEDs, there is a possibility that sufficient resolution may not be obtained.

A powder laser sintering apparatus, developed subsequent to optical forming apparatuses that use a photo-curable resin, is known among rapid prototyping systems, which are widely used at present. The powder laser sintering apparatus scans the surface of a powdered body with a laser beam in accordance with cross-sectional data of a three-dimensional model generated on a computer. Processing for curing the powdered body, including gradually melting and sintering the powdered body by scanning with laser light, is repeated. A three-dimensional model made of a laminated powdered sintered body is then formed due to the repetition of the processing.

The powder laser sintering apparatus has advantages in that various materials can be selected and it can directly manufacture not only function-evaluation models of superior toughness and precise cast patterns and dies, but also metallic molds and metallic parts, and it has a wide range of applications. Moreover, the laser sintering apparatus is less expensive than an optical forming apparatus and has a high forming speed. Therefore, its use for confirmation of design models is becoming more and more entrenched. However, because the powder laser sintering apparatus also uses a movable mirror system, such as a galvanometer mirror system, and a gas laser or a solid-state laser, such as a $CO_2$ laser (having a wavelength of 10.6 $\mu$m) or a YAG laser (having a wavelength of 1.06 $\mu$m), which output high-output infrared rays, as light sources, the apparatus has the same problems as the above-described optical forming apparatus.

SUMMARY OF THE INVENTION

The present invention has been achieved in order to solve the above-described problems of prior art, and an object thereof is to provide a laser sintering apparatus capable of realizing high-speed and highly detailed forming. Another object of the invention is to provide an inexpensive, high-speed, and highly precise laser sintering apparatus.

To achieve the above objects, the invention uses a laser sintering apparatus for forming a three-dimensional model by exposing a powdered body with a continuously-driven or pulse-driven laser beam in a predetermined wavelength region that includes ultraviolet, comprising an exposure component for exposing predetermined regions corresponding to a plurality of pixels on the surface of the powdered body with a continuously- or pulse-driven laser beam in a predetermined wavelength region including ultraviolet modulated every pixel correspondingly to the image data emitted from a light source and a moving component for moving the exposure component relatively to the surface of the powdered body.

By using a laser beam in a predetermined wavelength region including ultraviolet, it is possible to greatly increase a light absorption rate for a powdered body compared with the case of using a laser beam in an infrared wavelength region. Particularly, when a powdered body is made of a metal, the light absorption rate is greatly increased. Because a laser beam in a predetermined wavelength region including ultraviolet has a short wavelength, it has a large photon energy and thereby, it is easy to convert the laser beam into sintering energy for sintering a powdered body. Thus, because a laser beam in a predetermined wavelength region including ultraviolet has a large light absorption rate and it can be easily converted into sintering energy, it is possible to sinter a powdered body at a high speed. Moreover, the laser beam has a short wavelength, it is possible to condense the laser beam like a very small spot or thin line (such as 0.4 $\mu$m though the spot of a $CO_2$ laser is 10.6 $\mu$m), and it is possible to perform sintering very minutely.

Moreover, by exposing a powdered body with a pulse-driven laser beam, diffusion of heat produced due to irradiated light is prevented. Therefore, light energy is effectively used to sinter a powdered body and high-speed forming is realized. Moreover, heat diffusion is prevented, a powdered body is sintered at a size almost equal to the shape of an irradiated beam and very-minute forming at a smooth surface is realized. Therefore, it is preferable that a pulse-driven laser beam has a smaller pulse width. That is, a pulse width ranges preferably between 1 psec to 100 nsec and more preferably 1 psec to 300 psec. It is preferable that a predetermined wavelength region including ultraviolet ranges between 350 to 420 nm and the highest output can be expected for a wavelength of 405 nm as a predetermined wavelength region including ultraviolet because of using a GaN-based semiconductor laser at a lower cost.

In the case of the laser sintering apparatus, an exposure component exposes predetermined regions corresponding to a plurality of pixels on the surface of a powdered body with a continuously- or pulse-driven laser beam in a predetermined wavelength region including ultraviolet modulated every pixel correspondingly to the image data emitted from a light source. Therefore, it is possible to simultaneously sinter and cure predetermined regions corresponding to a plurality of pixels on the surface of the powdered body and thus realize very-minute forming. Moreover, because a moving component can move the exposure component relatively to the surface of the powdered body, it is possible to restrict the area of the predetermined regions to be simultaneously exposed by the exposure component, improve a spatial resolution, and realize very-minute forming.

In the case of the above laser sintering apparatus, it is possible to further increase the forming speed by using a plurality of exposure components and making each of the exposure components independently relatively movable to the surface of a powdered body.

An exposure component can be constituted by a light source and a spatial light modulator for modulating a continuously- or pulse-driven laser beam in a predetermined wavelength region including ultraviolet emitted from the light source every pixel in accordance with image data. The spatial light modulator can be constituted by, for example, a digital micromirror device or a grating light valve (GLV). Details of the GLV are described in the U.S. Pat. No. 5,311,360.

It is also allowed to constitute a laser sintering apparatus of the invention so as to be provided with an exposure component having a scanning function for scanning and exposing predetermined regions including a plurality of pixels for the image data on the surface of a powdered body with a laser beam in a predetermined wavelength region including ultraviolet modulated every pixel correspondingly to image data emitted from a light source and a moving component for moving the exposure component relatively to the surface of the powdered body. Because the laser sintering apparatus is provided with a scanning function for scanning and exposing predetermined regions including a plurality of pixels for the image data on the surface of a powdered body with a laser beam in a predetermined wavelength region including ultraviolet modulated every pixel correspondingly to the image data emitted from a light source, high-speed very-minute forming can be realized.

For example, it is allowed to constitute an exposure component by a light source and a space-modulation-device array in which spatial light modulators for respectively modulating a continuously- or pulse-driven laser beam in a predetermined wavelength region including ultraviolet emitted from the light source every pixel in accordance with image data in a first scanning direction (e.g. main scanning direction). In this case, a moving component moves the exposure component relatively to the surface of a powdered body so that the space-modulation-device array moves in a second scanning direction (e.g. subscanning direction) crossing the first scanning direction. Moreover, it is allowed that the space-modulation-device array scans in the main scanning direction and a movable mirror (scanner mirror) performs exposure in the subscanning direction. It is possible to use a digital micromirror device (DMD) in which linear grating light valves and micromirrors are linearly arranged as a spatial light modulator constituting the above space-modulation-device array.

A laser sintering apparatus of the invention is a laser sintering apparatus for forming a three-dimensional model by exposing a powdered body with a continuously- or pulse-driven laser beam in a predetermined wavelength region including ultraviolet. Moreover, it is allowed that the laser sintering apparatus is a laser sintering apparatus comprising an exposure component in which a plurality of exposure units for scanning and exposing predetermined regions corresponding to a plurality of pixels on the surface of a powdered body with a continuously- or pulse-driven laser beam in a predetermined wavelength region including ultraviolet modulated every pixel correspondingly to image data emitted from a light source are arranged like an array.

The above laser sintering apparatus realizes high-speed very-minute forming because the exposure units arranged on the exposure component like an array scan and expose regions corresponding to a plurality of pixels on the surface of a powdered body with a continuously- or pulse-driven laser beam in a predetermined wavelength region including ultraviolet modulated every pixel in accordance with image data emitted from a light source.

In the case of the above laser sintering apparatus, the above exposure units can be respectively constituted by including a light source, a condensing optical system for condensing a continuously- or pulse-driven laser beam in a predetermined wavelength region including ultraviolet emitted from the light source, and a deflection device for modulating the continuously- or pulse-driven laser beam in the predetermined wavelength region including ultraviolet condensed by the condensing optical system every pixel in accordance with image data. Because each of the exposure units is downsized compared to a case of using a conventional paired movable mirrors by using a modulating deflection device for each pixel in accordance with image data. Therefore, it is possible to arrange many exposure units on an exposure component and moreover, realize high-speed very-minute forming, and decrease an exposure region per exposure unit. Therefore, it is possible to eliminate most pincushion errors. Moreover, each of the exposure unit can be constituted so that a light source, a condensing optical system, and a deflection device are sealed in a package. The deflection device can use a two-dimensional microscanner.

The light source can use the following light source for emitting a continuously- or pulse-driven laser beam in a predetermined wavelength region including ultraviolet. The light absorption rate of a powdered body (particularly, a metallic powdered body) to a laser beam in a predetermined wavelength region including ultraviolet is very high compared to a conventional light absorption rate to infrared light. Moreover, because the wavelength of a laser beam in a predetermined wavelength region including ultraviolet is very small compared to that of infrared light, it is possible to condense the laser beam at a very small spot. As a result, high-speed exposure can be made even with an output smaller than a laser output used for a conventional powdered body. Therefore, by using a laser beam in a predetermined wavelength region including ultraviolet, it is possible to perform high-speed very-minute laser sintering compared to a case of using infrared light. Moreover, by using a pulse-driven laser beam in a predetermined wavelength region including ultraviolet, heat diffusion is prevented and thereby high-speed very-minute forming is realized. That is, by using continuously or pulse-driven laser beam in a predetermined region including ultraviolet as a light source, it is unnecessary to use an expensive gas laser or solid-state laser and it is possible to provide a high-speed very-minute laser sintering apparatus.

(1) Gallium-nitride-based-semiconductor laser. For example, it is allowed to use a gallium-nitride-based-semiconductor laser having a broad-area light-emitting region, a semiconductor laser having a 10 mm-long bar-type structure, or a semiconductor laser constituted by a gallium-nitride-based semiconductor-laser chip having a plurality of light-emitting points. Moreover, by using an array-type semiconductor laser constituted by mounting a plurality of gallium-nitride-based semiconductor-laser chips respectively having a plurality of light-emitting points, it is possible to obtain a higher output.

(2) Semiconductor-laser-exciting solid-state laser for emitting a laser beam obtained by exciting solid-state-laser crystal by a gallium-nitride-based-semiconductor laser by wavelength-converting the laser beam by a light-wavelength conversion device. For example, it is allowed to use solid-state laser crystal to which at least $Pr^{3+}$ is added as a rare earth element, a gallium-nitride-based-semiconductor laser for emitting a laser beam for exciting the solid-state-laser crystal, or a semiconductor-laser-exciting solid-state laser provided with a light-wavelength conversion device for light-wavelength-converting a laser beam obtained by exciting the solid-state-laser crystal into the light in an ultraviolet region.

The solid-state-laser crystal to which $Pr^{3+}$ is added is excited by a GaN-based semiconductor laser and effectively oscillated in a wavelength band of 700 to 800 nm. That is, because a solid-state laser beam in an infrared region at a wavelength of 720 nm which is an oscillation line of $Pr^{3+}$ is efficiently oscillated in accordance with transition of, for example, $^3P_0 \rightarrow ^3F_4$, it is possible to obtain high-intensity ultraviolet light at a wavelength of 360 nm by wavelength-converting the solid-state laser beam into second harmonic by a light-wavelength conversion device. Moreover, a low-cost laser-exciting solid-state laser is realized without complicating a configuration like a case of generating third harmonic.

(3) Fiber laser for emitting a laser beam obtained by exciting a fiber by a gallium-nitride-based-semiconductor laser by light-wavelength-converting the laser beam by a light-wavelength conversion device. For example, it is allowed to use a fiber having a core jointly doped with at least one of $Er^{3+}$, $Ho^{3+}$, $Dy^{3+}$, $Eu^{3+}$, $Sn^{3+}$, $Sm^{3+}$, and $Nd^{3+}$ on one hand and $Pr^{3+}$ on the other, a gallium-nitride-based-semiconductor laser for emitting a laser beam for exciting the fiber, or a fiber laser provided with a light-wavelength conversion device for wavelength-converting a laser beam obtained by exciting the fiber.

$Er^{3+}$, $Ho^{3+}$ $Dy^{3+}$, $Eu^{3+}$, $Sn^{3+}$, $Sm^{3+}$, and $Nd^{3+}$ respectively have an absorption band in a wavelength of 380 to 430 nm, which can be excited by a GaN-based semiconductor laser. Moreover, by energy-moving excited electrons to the exciting level of $Pr^{3+}$ (e.g. $^3P_0 \rightarrow ^3F_1$) and dropping the electrons to a lower level, it is possible to oscillate blue, green, and red regions which are oscillation lines of $Pr^{3+}$. The wavelength of 380 to 430 nm is a wavelength band that is comparatively easily oscillated by a GaN-based semiconductor laser. Particularly, a wavelength of 400 to 410 nm is a wavelength band from which the maximum output of a GaN-based semiconductor laser can be obtained. Therefore, by exciting $Er^{3+}$, $Ho^{3+}$, $Dy^{3+}$, $Eu^{3+}$, $Sn^{3+}$, $Sm^{3+}$, and $Nd^{3+}$ by a GaN-based semiconductor laser, the absorption quantity of excited light increases and high efficiency and high output are achieved. Moreover, a concise configuration requiring less optical components is obtained, losses are reduced, and a temperature stabilization region is widened.

It is possible to use not only the single length and breadth mode type as a GaN-based semiconductor laser serving as an exciting light source but also the broad-area type, phased-array type, and MOPA type, or one or more fiber-type high-output types obtained by multiplexing a GaN-based semiconductor laser and connecting with a fiber. Moreover, it is possible to use a fiber laser as an exciting light source. Thus, by using a high-output exciting light source, it is possible to obtain a higher output such as a W (watt)-class high output. Furthermore, a laser using $Pr^{3+}$ having a wide emission spectrum, as mentioned in (2), (3), can be easily psec-pulse-driven by mode locking and can be repetitively operated. Furthermore, because of psec oscillation, high-efficiency wavelength conversion is realized.

(4) Fiber laser or fiber amplifier for emitting a laser beam obtained by exciting a fiber by a semiconductor laser for emitting the light in an infrared region by wavelength-converting the laser beam by a light-wavelength conversion device. For example, it is allowed to use a fiber having a core doped with $Nd^{3+}$ or $Yb^{3+}$ or both $Er^{3+}$ and $Yb^{3+}$, a semiconductor laser for emitting a laser beam in an infrared region for exciting the fiber, or a fiber laser or fiber amplifier provided with a light-wavelength conversion device for wavelength-converting a laser beam obtained by exciting the fiber into light in an ultraviolet region. The light-wavelength conversion device can use a THG (third-harmonic-generation) device or an FHG (fourth-harmonic-generation) device.

By using a fiber laser, it is possible to improve the mode matching between exciting light and an oscillation beam for a conventional solid-state laser. Therefore, it is possible to realize a high efficiency. Moreover, in the case of a fiber laser system, it is possible to stably constitute a mode-locking mechanism for a conventional solid-state laser at a low cost, make the oscillation spectrum of the above fiber laser broad, and perform short-pulse driving (psec) and a high repetitive operation (100 MHz). As a result, it is possible to obtain THG light and FHG light according to wavelength conversion at a high efficiency.

Moreover, in the case of a fiber amplifier, by using LD light which can be repeatedly used many times and made short-pulse as a main light source, it is possible to realize a high output by the fiber amplifier and obtain THG light and FHG light according to wavelength conversion at a high efficiency. Thus, it is possible to obtain a high-output and high-repetitive ultraviolet laser beam for a conventional solid-state laser. As a result, a low-cost light source suitable for high-speed exposure is obtained.

(5) Laser obtained by multiplexing a gallium-nitride-based-semiconductor laser to a fiber. For example, it is possible to obtain a high output from a fiber by multiplexing and combining a plurality of gallium-nitride-based-semiconductor lasers with a multiplexing optical system. It is also allowed to use a laser obtained by multiplexing a semiconductor laser using a semiconductor laser chip for emitting a plurality of beams into a fiber with a condensing optical system. Moreover, it is allowed to multiplex a gallium-nitride-based-semiconductor laser beam having a broad-area light-emitting region into a fiber. By arranging these fibers like an array and using the array as a linear light source or arranging them like a bundle and using the bundle as a flat light source, it is possible to obtain a higher output.

(6) Moreover, it is allowed to constitute a light source by including a plurality of laser beam sources and a multiplexing optical system for multiplexing laser beams emitted from the laser beam sources. As the above laser beam source, it is possible to use any one of the laser beam sources in the above Items (1) to (5). It is possible to raise the output of the laser beam source by using the multiplexing optical system and thereby multiplexing the laser beams emitted from the laser beam sources.

Moreover, the above-described former laser beam source can not only realize a tens-of-Ws-class output that has not been ever used but also realize short-pulse oscillation at psec order and high-speed very-minute exposure.

Particularly, because a gallium-nitride-based-semiconductor laser is a semiconductor laser, it is possible to constitute the laser as a low-cost system. Moreover, because a gallium-nitride-based-semiconductor laser has a very small mobility of transfer and a very-large thermal conductance, it has a very high COD (Catastrophic Optical Damage) value compared to a light source in an infrared wavelength region. Moreover, because the laser is a semiconductor laser, it allows repetitive operations in accordance with pulses having a high peak power in a short cycle. Therefore, a gallium-nitride-based-semiconductor laser is a light source well suited for an inexpensive high-speed very-minute laser sintering apparatus.

A laser sintering apparatus of the invention has an advantage that high-speed and very-minute forming can be realized. Moreover, an exposure unit of the invention is decreased in size compared to a conventional one. Therefore, an advantage can be obtained that it is possible to arrange many exposure units. Moreover, when using a predetermined laser beam source as a light source, advantages are obtained that it is possible to provide an inexpensive high-speed and very-minute laser sintering apparatus and an exposure unit.

BRIEF DESCRIPTION OF THE DRAWINGS

FIG. 20 is a perspective view sowing a schematic configuration of a laser sintering apparatus of fourth embodiment of the invention.

FIG. 21 is a perspective view of a semiconductor laser chip at a light source.

FIG. 22A is a top view of a semiconductor laser chip at a light source.

FIG. 22B is a sectional view along the optical axis in FIG. 22A.

FIGS. 26A and 26B are illustrations of the operation principle of a GL device.

DESCRIPTION OF THE PREFERRED EMBODIMENTS

Embodiments of the present invention are described below by referring to the accompanying drawings. The embodiments respectively use a laser in a predetermined wavelength region including ultraviolet.

(First Embodiment)

Figure 1:
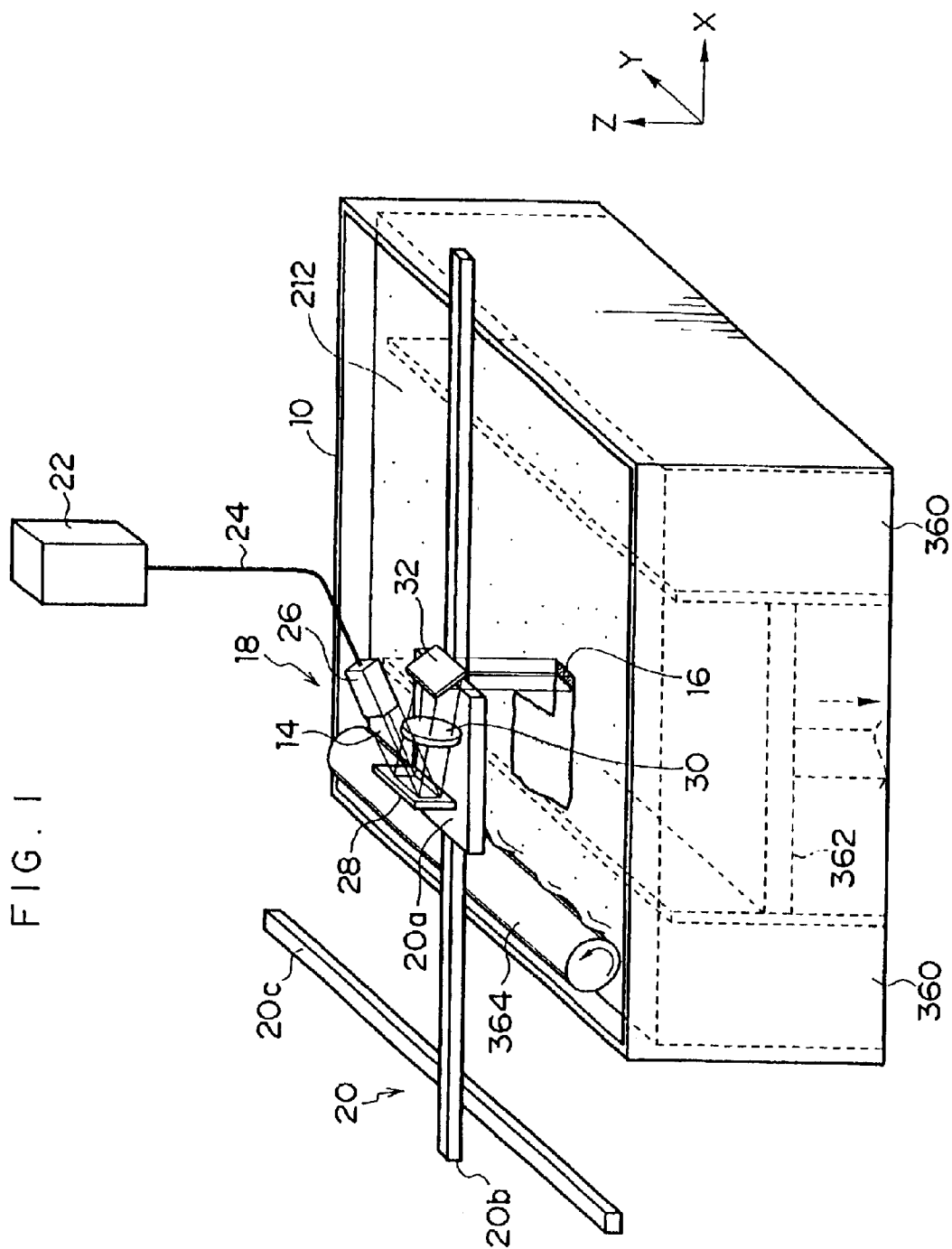
FIG. 1 is a perspective view showing a schematic configuration of a laser sintering apparatus of first embodiment of the present invention.

As shown in FIG. 1, the laser sintering apparatus of the first embodiment of the invention has a part cylinder 362 provided with a floor, which lowers according to laser sintering, and a feed cylinder 360 for supplying materials set to the both sides of the part cylinder 362 at the center of a forming chamber 10. A roller 364 to be reciprocated while being inversely rotated from one feed cylinder 360 to the other feed cylinder 360 is set to upper portions of the part cylinder 362 and feed cylinders 360. The roller 364 supplies a powdered body 212 serving as a material from the feed cylinders 360 onto the part cylinder 362 to flatten the powdered body 212 so as to become a constant level. An exposure unit 18 for exposing a region 16 having a predetermined area corresponding to a plurality of pixels on the surface of the powdered body by a laser 14 is set above the surface of the powdered body 212 housed on the part cylinder 362. The exposure unit 18 is set so that it can be moved by an XY-positioning mechanism 20 in the horizontal direction (XY directions) to the surface of the powdered body.

The XY-positioning mechanism 20 is constituted by a fixing table 20a for fixing the exposure unit 18, a supporting body 20b for supporting the supporting body 20b so as to be movable in Y-direction together with the fixing table 20a. Moreover, when the fixing table 20a slides on the supporting body 20b in X-direction, the exposure unit 18 is moved in X-direction and the position of the exposure unit 18 in X-direction is decided. When the supporting body-20 slides on a supporting body 20c in Y-direction, the exposure unit 18 is moved in Y-direction and the position of the exposure unit 18 in Y-direction is decided. A rack-and-pinion and a ball screw serve as mechanisms for sliding the fixing table 20a and the supporting body 20b.

Figure 2:
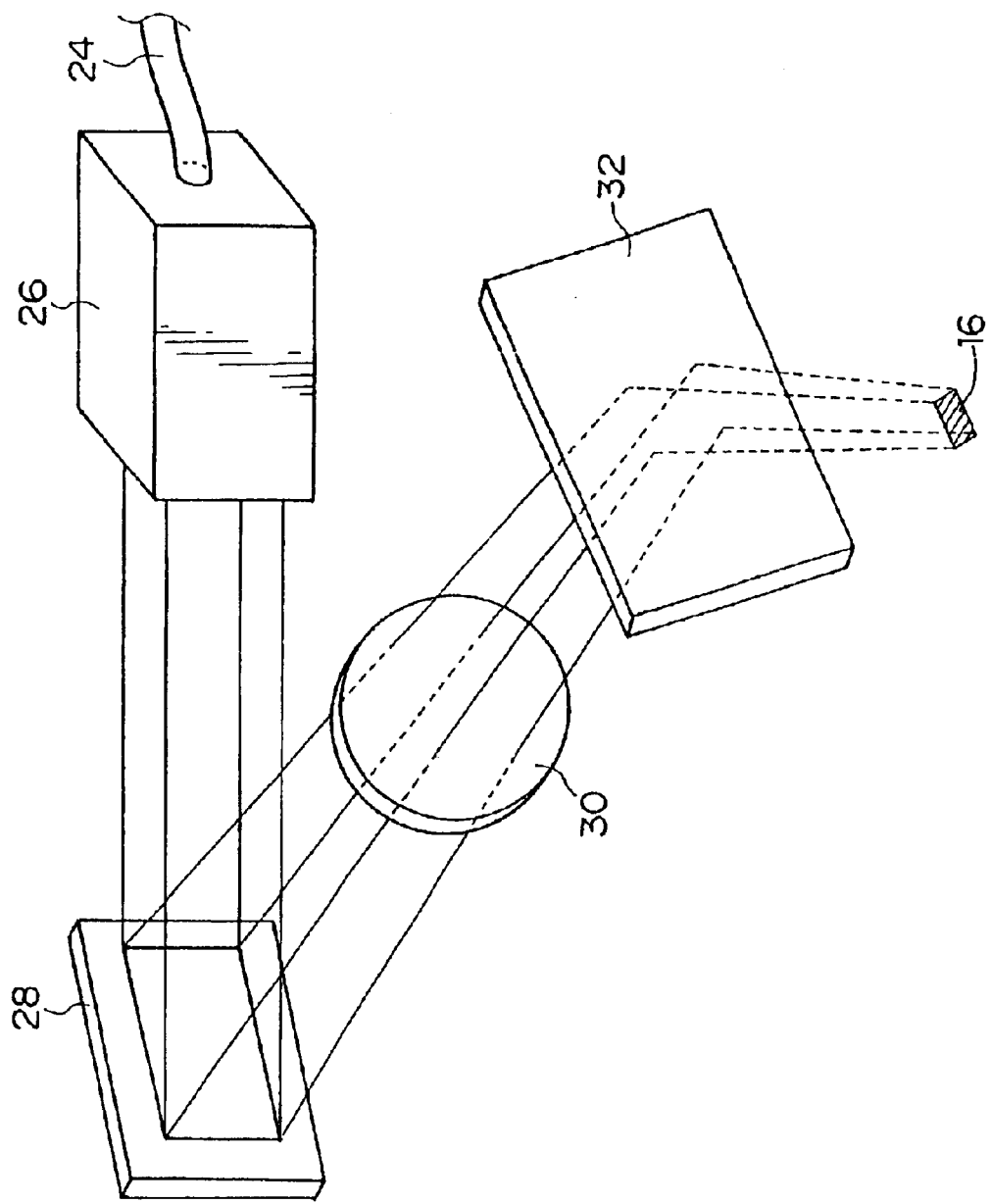
FIG. 2 is a partial enlarged view showing a configuration of an exposure unit of the laser sintering apparatus of the first embodiment of the invention.

As shown in FIGS. 1 and 2, the exposure unit 18 is provided with a homogenizer optical system 26 serving as a shaping optical system for collimating laser beams 14 of 50 W (=0.5 W×100 optical fibers) incoming through an optical fiber 24 obtained by connecting bundled optical fibers (e.g. 100 fibers) respectively having a core diameter of 10 to 200 m from a laser beam source 22 for emitting a laser beam of about 0.5 W, shaping the waveforms of the laser beams 14, and converting the intensity distribution of the laser beams 14 in a plane vertical to the optical axis into a rectangular, a digital micromirror devices (DMD) 28 two-dimensionally arranged to modulate the laser beams incoming from the homogenizer optical system 26 every pixel in accordance with the image data of about one million pixels, a condensing lens 30 for condensing the laser beams incoming from the DMD 28, and a fixed reflection mirror 32 for reflecting the laser beams passing through the condensing lens 30 in the direction of the surface of the powdered body 212.

The XY-positioning mechanism 20, laser-beam source 22, and DMD 28 are connected to a controller (not illustrated) for controlling them.

Figure 3A:
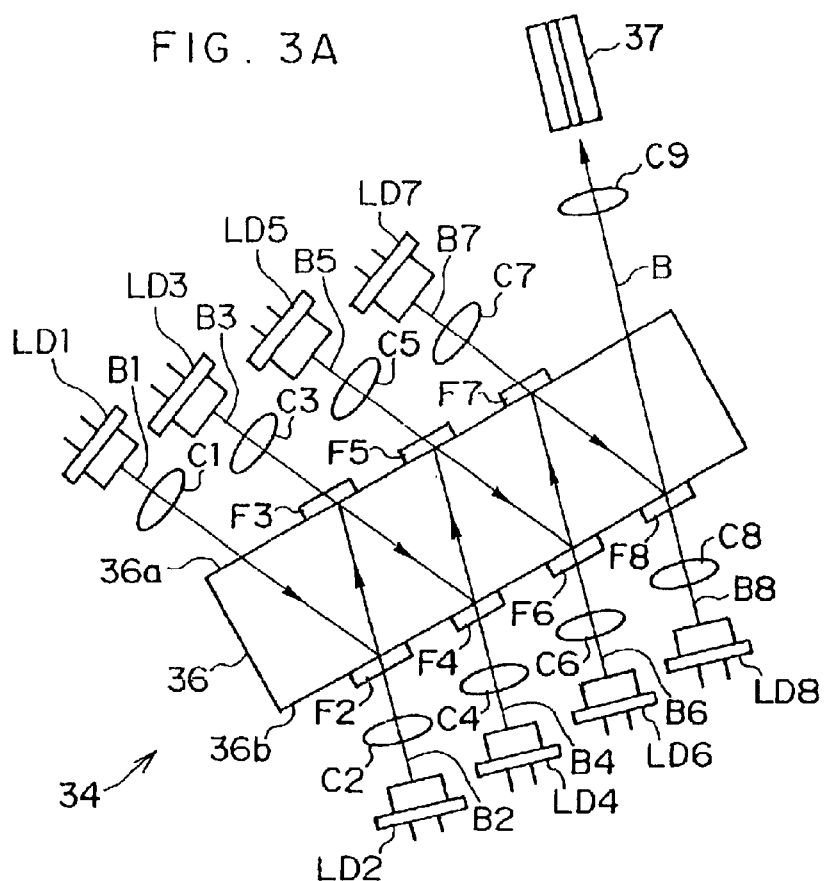
FIG. 3A is a top view showing a configuration of an ultraviolet light source of the laser sintering apparatus of the first embodiment of the invention.

As shown in FIG. 3A, the laser-beam source 22 constituted by multiplexing and connecting gallium-nitride-based-semiconductor lasers to fibers is constituted by, for example, eight multimode gallium-nitride (GaN)-based semiconductor lasers LD1, LD2, LD3, LD4, LD5, LD6, LD7, and LD8 and a multiplexing optical system 34. Wavelengths that can be oscillated at a high output are selected in a range of 390 to 410 nm as oscillation wavelengths of the GaN-based semiconductor lasers LD1 to LD8. For example, wavelengths of 395, 396, 397, 398, 399, 400, 401, and 402 nm are selected which are different from each other 1 nm by 1 nm. In this case, the output of each laser is 100 mW.

Collimating lenses C1 to C8 for collimating laser beams B1 to B8 under a divergent-light state emitted from the GaN-based semiconductor lasers LD1 to LD8 are set respectively correspondingly to the lasers LD1 to LD8.

Figure 4:
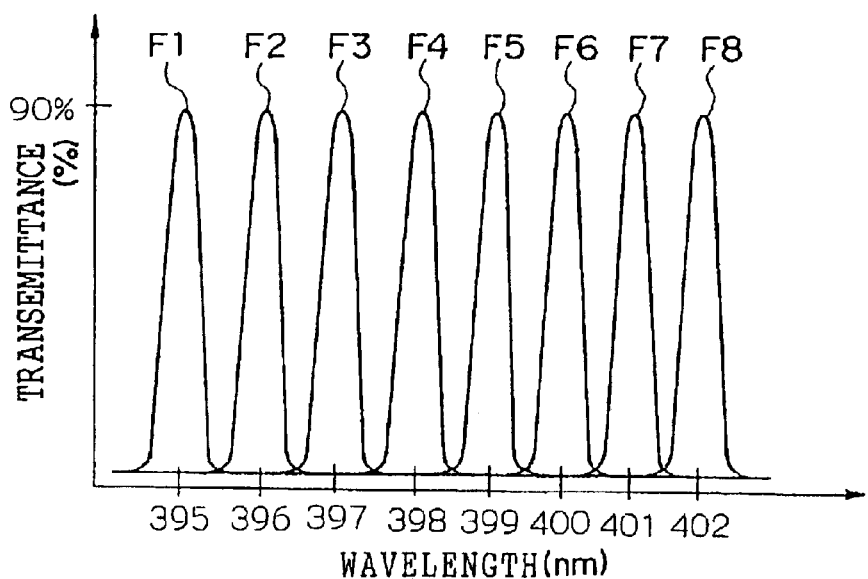
FIG. 4 is a graph showing the transmission characteristic of a narrow-band-pass filter of the ultraviolet light source shown in FIGS. 3A and 3B.

The multiplexing optical system 34 is constituted by a parallel-plate prism 36, narrow-band-pass filters F3, F5, and F7 attached to one surface 36a of the prism 36, and narrow-band-pass filters F2, F4, F6, and F8 attached to the other surface 36b of the prism 36. These narrow-band-pass filters F2 to F8 are formed so as to reflect the light incoming from the attachment face attached with the surface 36a of the parallel-plate prism 36 at a reflectance of 98% and pass the light in a predetermined wavelength band incoming from the opposite side to the attachment face at a transmittance of 90%. FIG. 4 shows transmission spectrums of these narrow-band-pass filters F2 to F8 together with the transmission spectrum of a narrow-band-pass filter F1 to be described later.

Figure 3B:
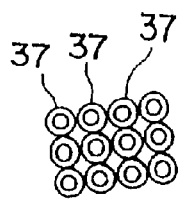
FIG. 3B is a top view showing end faces of fibers arranged like a bundle.

The GaN-based semiconductor lasers LD1 to LD8 are set so that the laser beams B1 to B8 emitted from the lasers LD1 to LD8 enter the narrow-band-pass filters F2 to F8 at an incident angle of 5°. The laser beams B1 to B8 having wavelengths of 395, 396, 397, 398, 399, 400, 401, and 402 nm emitted from the GaN-based semiconductor lasers LD1 to LD8 enter the parallel-plate prism 36 and then, they are multiplexed into one laser beam while being reflected from the narrow-band-pass filters F2 to F8 A wavelength-multiplexed high-output (e.g. about 0.5 W) laser beam B is emitted from the parallel-plate prism 36, condensed by a lens C9, and connected to multimode fibers 37 respectively having a core diameter of about 10 m and an NA of 0.3. As shown in FIG. 3B, the multimode fibers 37 are arranged so that incident end faces of the fibers 37 is shaped like a bundle to obtain a flat beam of 50 W by bundling, for example, 100 fibers 37.

Figure 5A:
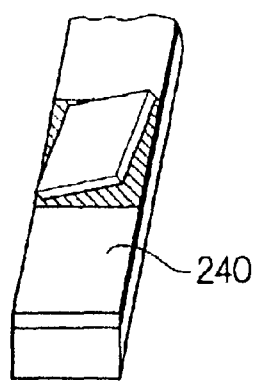
FIG. 5A is an enlarged view of a DMD.
Figure 5B:
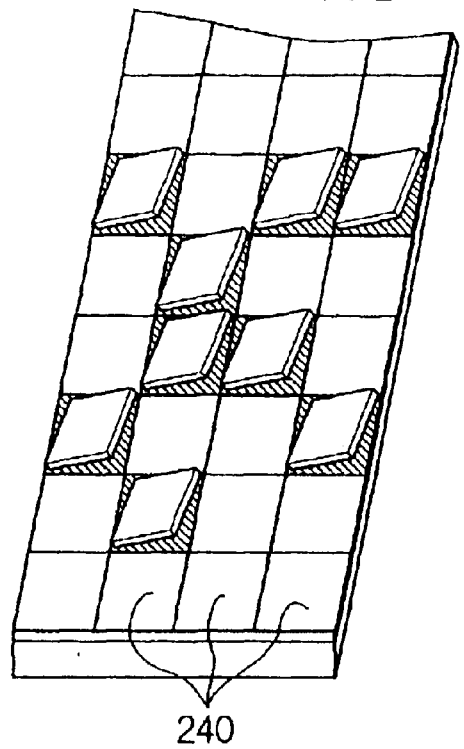
FIG. 5B is an illustration showing linearly arranged DMDs.
Figure 5C:
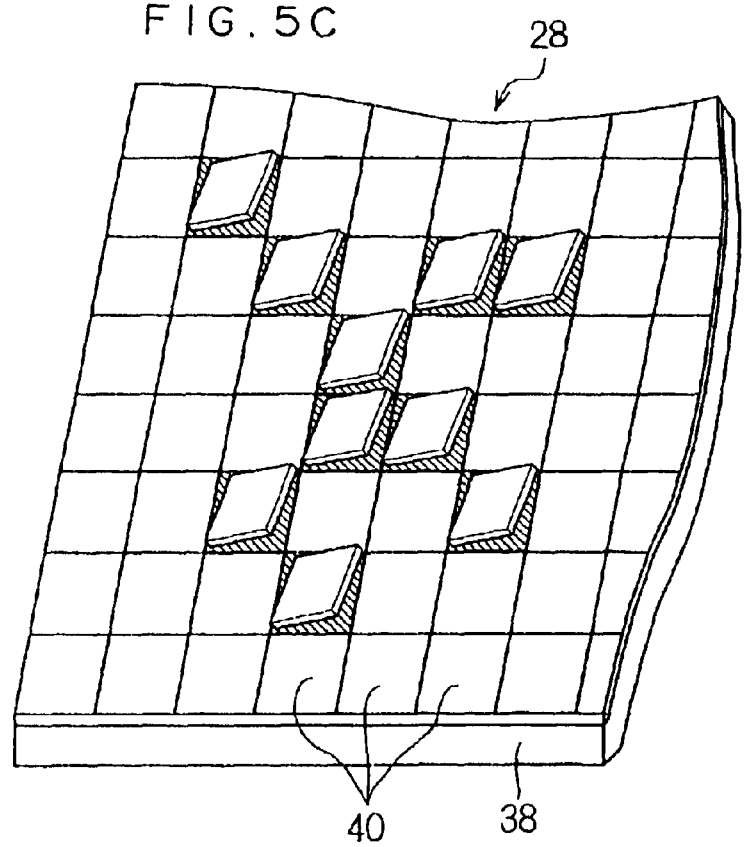
FIG. 5C is an illustration showing DMDs arranged like a two-dimensional array.

As shown in FIG. 5C, the DMD 28 is constituted by arranging micromirrors 40 on an SRAM (memory cell) 38 while supporting the micromirrors 40 with struts, which is a mirror device constituted by arranging pixels serving as many (hundred thousands to millions of) micromirrors like a grating. Each micromirror 40 supported by a strut is set to the uppermost portion of each pixel and aluminum is deposited on the surface of the micromirror 40. The micromirror 40 has a reflectance of 90% or more. Moreover, the SRAM 38 of a CMOS of a silicon gate fabricated in the normal semiconductor-memory fabrication line is set immediately below the micromirror 40 through a strut including a hinge and a yoke and the whole structure is monolithically (integrally) constituted.

Figure 6A:
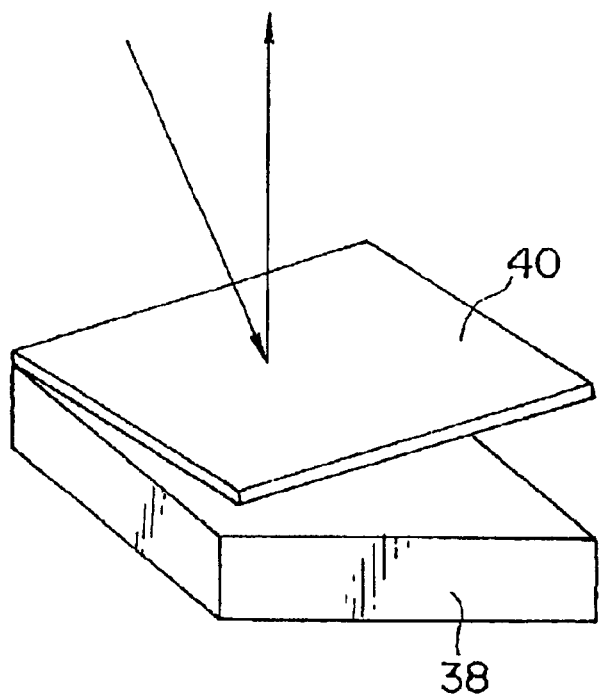
FIGS. 6A and 6B are illustrations for explaining operations of a DMD.
Figure 6B:
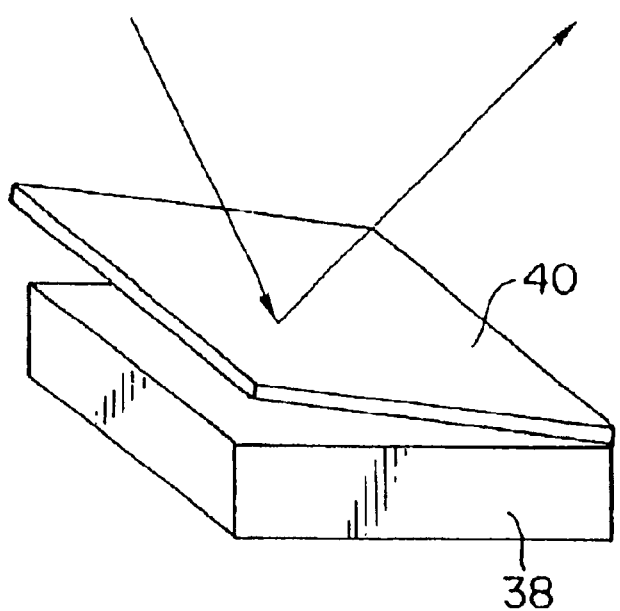

When a digital signal is written in the SRAM cell 38 of the DMD 28, the micromirror 40 supported by a strut is tilted toward a substrate on which the DMDs 28 are arranged about the diagonal line in a range of $\pm\alpha°$ (e.g. $\pm10°$). FIG. 6A shows a state in which the micromirror 40 is tilted up to $+\alpha°$ while it is turned on and FIG. 6B shows a state in which the micromirror 40 is tilted up to $-\alpha°$ while it is turned off. Therefore, by controlling the tilt of the micromirror 40 in each pixel of the DMD 28 as shown in FIG. 5C in accordance with an image signal, the light entering the DMD 28 is reflected in the tilted direction of each micromirror 40. FIG. 5C shows a state in which a part of the DMD 28 is enlarged and the micromirrors 40 are controlled. Each micromirror 40 is turned on/off by a controller (not illustrated) connected to the DMD 28. Light-absorption bodies (not illustrated) are arranged in the direction in which a laser beam is reflected from a turned-off micromirror 40.

Then, operations of the above laser sintering apparatus are described. The material feed roller 364 is moved by a controller (not illustrated) while being rotated and the powdered body 212 is supplied from either of the right and left feed cylinders 360 onto the powdered body 212 housed on the part cylinder 362. The material feed roller is moved toward the other feed cylinder 360 and rotated in the opposite direction to the moving direction, and thereby the powdered body 212 is spread and flattened on the part cylinder 362. The surface of the powdered body 212 is flattened so as to coincide with the focused position of the exposure unit 18. The XY-positioning mechanism 20 is driven by a controller (not illustrated), the exposure unit 18 is moved in X- and Y-directions and the first position of the exposure unit 18 in X- and Y-directions is decided. When the first position of the exposure unit 18 is decided, a laser beam is emitted from the laser-beam source 22 and image data in the region 16 having a predetermined area corresponding to the first position of the exposure unit 18 is transmitted to a controller (not illustrated) of the DMD 28. The micromirrors 40 of the DMD 28 are turned on/off in accordance with the received image data.

The laser beam 14 emitted from the laser-beam source 22 is supplied to the homogenizer optical system 26 through the optical fiber 24 and collimated, and the intensity distribution in a plane vertical to the optical axis in which their waveforms are shaped is converted into a rectangle and supplied to the DMD 28. The laser beam 14 supplied from the homogenizer optical system 26 is reflected in the direction of the reflection mirror 32 when the micromirrors 40 of the DMD 28 are turned on but the system 26 is reflected in the direction of a light absorption body (not illustrated) when the micromirrors 40 are turned off. That is, the laser beam 14 supplied to the DMD 28 is modulated every pixel in accordance with image data. The laser beam 14 reflected in the direction of the reflection mirror 32 is condensed by the condensing lens 30 and the condensed laser beam 14 is reflected from the reflection mirror 32 in the direction of the surface of the powdered body 212. Thereby, the inside of the region 16 having the predetermined area on the surface of the powdered body 212 is exposed by the laser beam 14 and the portion in the region 16 exposed by the laser beam 14 is cured.

When exposure of the region 16 having a predetermined area at the first position is completed, the exposure unit 18 is moved by the XY-positioning mechanism 20 in X- and Y-directions, the second position of the exposure unit 18 in X- and Y-directions is decided, and the region 16 having a predetermined area corresponding to the second position is exposed. Thus, by repeating movement and exposure of the exposure unit 18, it is possible to expose the entire surface of the powdered body 212.

For example, when assuming the spot diameter of a laser beam on the surface of the powdered body 212 as 50 µm and using the exposure unit 18 provided with the DMD 28 of one million (1,000×1,000) pixels, it is possible to expose the region having an area of 50 mm×50 mm at the same time. In this case, when assuming the entire exposure area of the surface of the powdered body 212 as 500 mm×500 mm, it is possible to expose the entire surface by dividing the surface into 100 regions and exposing each region while shifting the position of the exposure unit 18.

When the powdered body 212 is melted and cured, it is contracted in the direction of Z-axis and settled. By curing the powdered body 212 so that the powdered body 212 can be easily supplied by the material feed roller 364, the floor surface of the part cylinder 362 is lowered by the thickness of a produced laminate to flush the uppermost face of the laminate with the height of the uppermost portion of the feed cylinder. Then, similarly to the above described, the material feed roller 364 is driven to form the laminate of the powdered body 212. By repeating the above lamination and exposure, laser sintering is performed.

As described above, in the case of the laser sintering apparatus of this embodiment, because an exposure unit is provided with a DMD, it is possible to expose regions respectively having a predetermined area at the same time and realize forming at a high speed. Moreover, because the exposure unit can be moved by an XY-positioning mechanism and the entire surface can be exposed by dividing the surface into a plurality of regions and exposing each region while shifting the position of the exposure unit, it is possible to restrict areas of regions to be simultaneously exposed by one exposure unit, improve a spatial resolution, and perform very-minute forming.

Moreover, because a laser-beam source constituted by a plurality of GaN-based semiconductor lasers and a multiplexing optical system generates a high output and is realized at a low cost, it is possible to reduce the whole fabrication cost of a laser sintering apparatus. Particularly, when comparing a laser sintering apparatus of the invention with a conventional sintering apparatus using a gas laser such as a YAG laser or $CO_2$ laser, advantages are obtained that the apparatus of the invention is inexpensive, easily maintained, and decreased in size.

Moreover, because of curing an ultraviolet-light source outside of an exposure unit and connecting the exposure unit with the ultraviolet-light source by an optical fiber, it is possible to decrease the exposure unit in weight, reduce the load applied to an XY-positioning mechanism, and move the exposure unit at a high speed.

Though an example is described above in which an ultraviolet-light source uses an ultraviolet-laser-beam source constituted by a plurality of GaN-based semiconductor lasers and a multiplexing optical system. However, it is allowed to constitute an ultraviolet-light source by any one of the light sources in the following Items (1) to (6).

Figure 7:
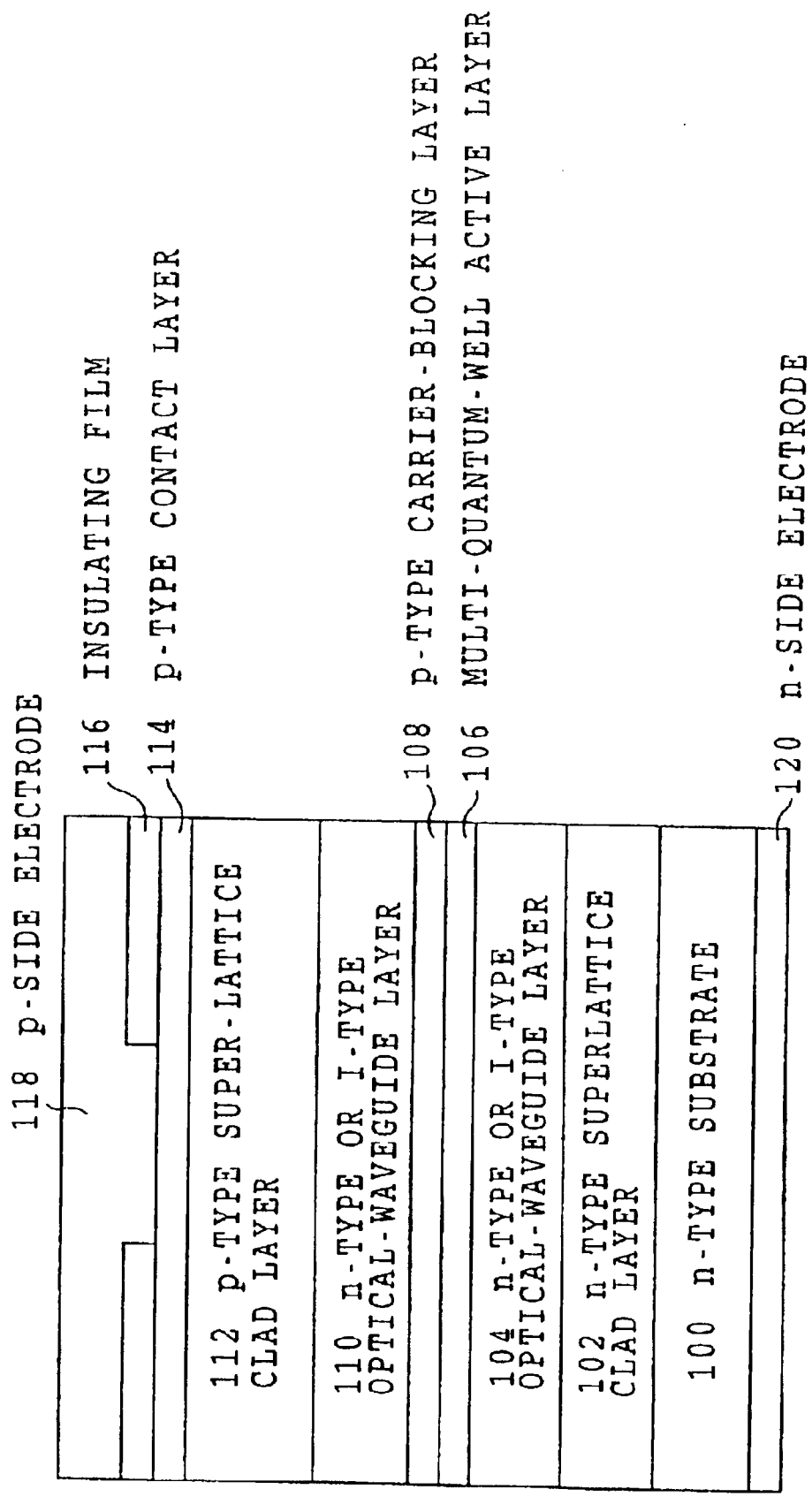
FIG. 7 is a schematic sectional view showing a laminated structure of a GaN-based semiconductor laser having a light-emitting region of a broad area, which can be used, as an ultraviolet light source of the laser sintering apparatus of the first embodiment of the invention.

(1) A gallium-nitride-based-semiconductor laser shown in FIG. 7. Preferably, an array-type semiconductor laser constituted by a plurality of gallium-nitride-based-semiconductor lasers shown in FIG. 21 and FIGS. 22A and 22B.

Figure 8:
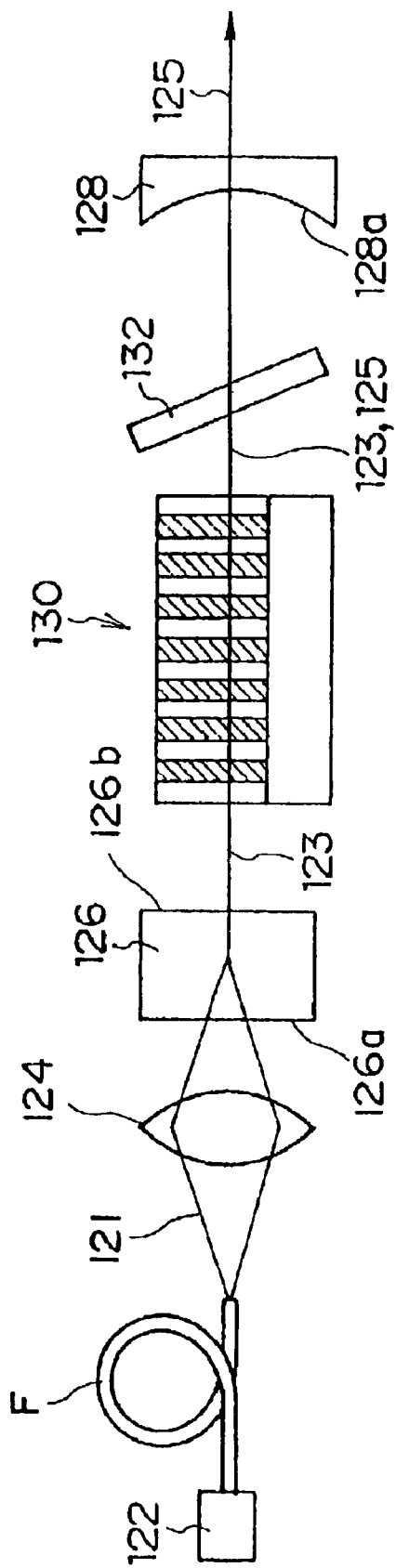
FIG. 8 is a schematic sectional view showing a configuration of a semiconductor-laser-exciting solid-state laser, which can be used, as the ultraviolet light source of the laser sintering apparatus of the first embodiment of the invention.

(2) A semiconductor-laser-exciting solid-state laser shown in FIG. 8 for emitting a laser beam obtained by exciting solid-state laser crystal with a gallium-nitride-based-semiconductor laser by wavelength-converting the laser beam with a light-wavelength conversion device.

Figure 10:
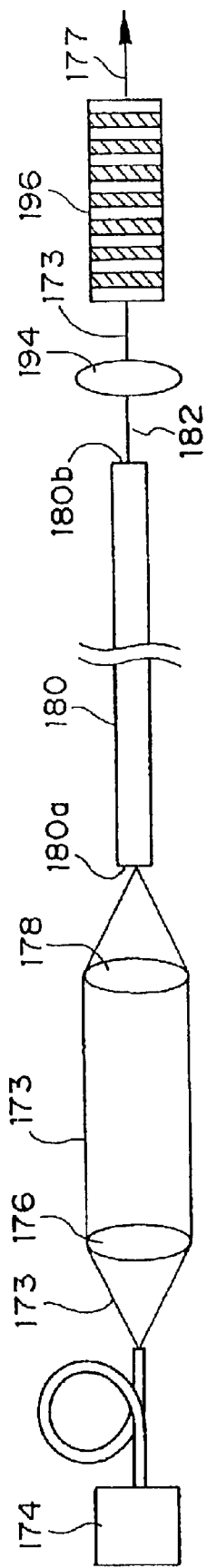
FIG. 10 is a schematic sectional view showing a configuration of an SHG (second-harmonic-generation) fiber laser, which can be used, as the ultraviolet light source of the laser sintering apparatus of the first embodiment of the invention.

(3) A fiber laser shown in FIG. 10 for emitting a laser beam obtained by exciting a fiber with a gallium-nitride-based-semiconductor laser by light-wavelength-converting the laser beam with a light-wavelength conversion device.

Figure 9:
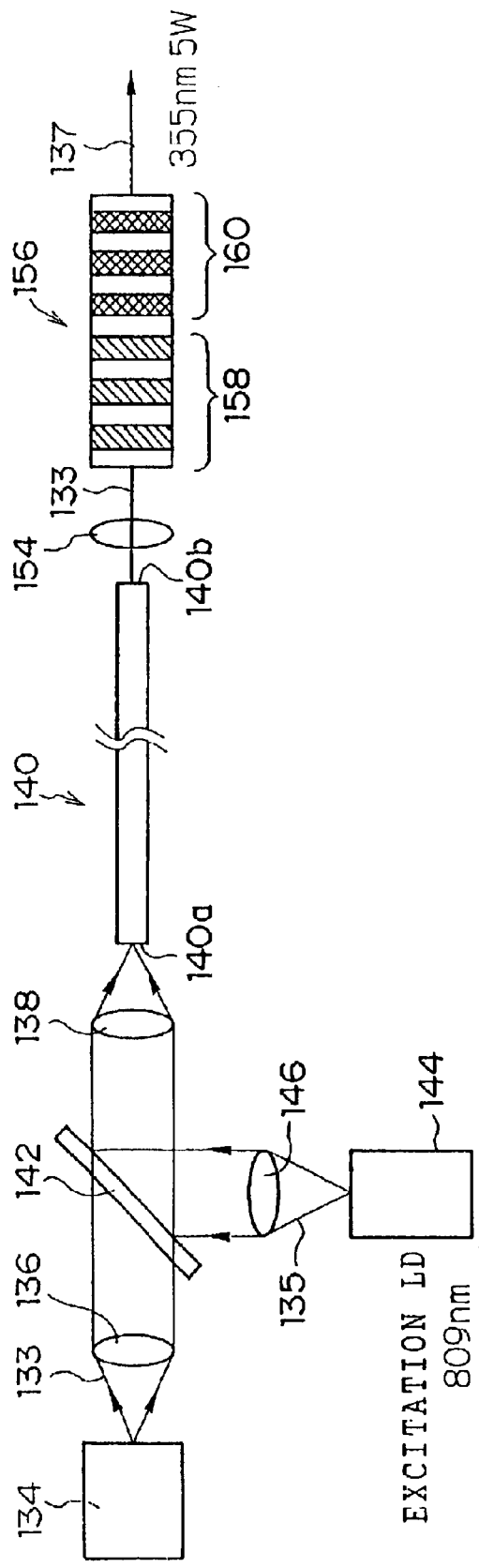
FIG. 9 is a schematic sectional view showing a configuration of a THG (third-harmonic-generation) fiber laser, which can be used, as the ultraviolet light source of the laser sintering apparatus of the first embodiment of the invention.

(4) A fiber laser or fiber amplifier shown in FIG. 9 for emitting a laser beam obtained by exciting a fiber with a gallium-nitride-based-semiconductor laser or emitting the light in the infrared region by wavelength-converting the laser beam with a light-wavelength conversion device.

Figure 23:
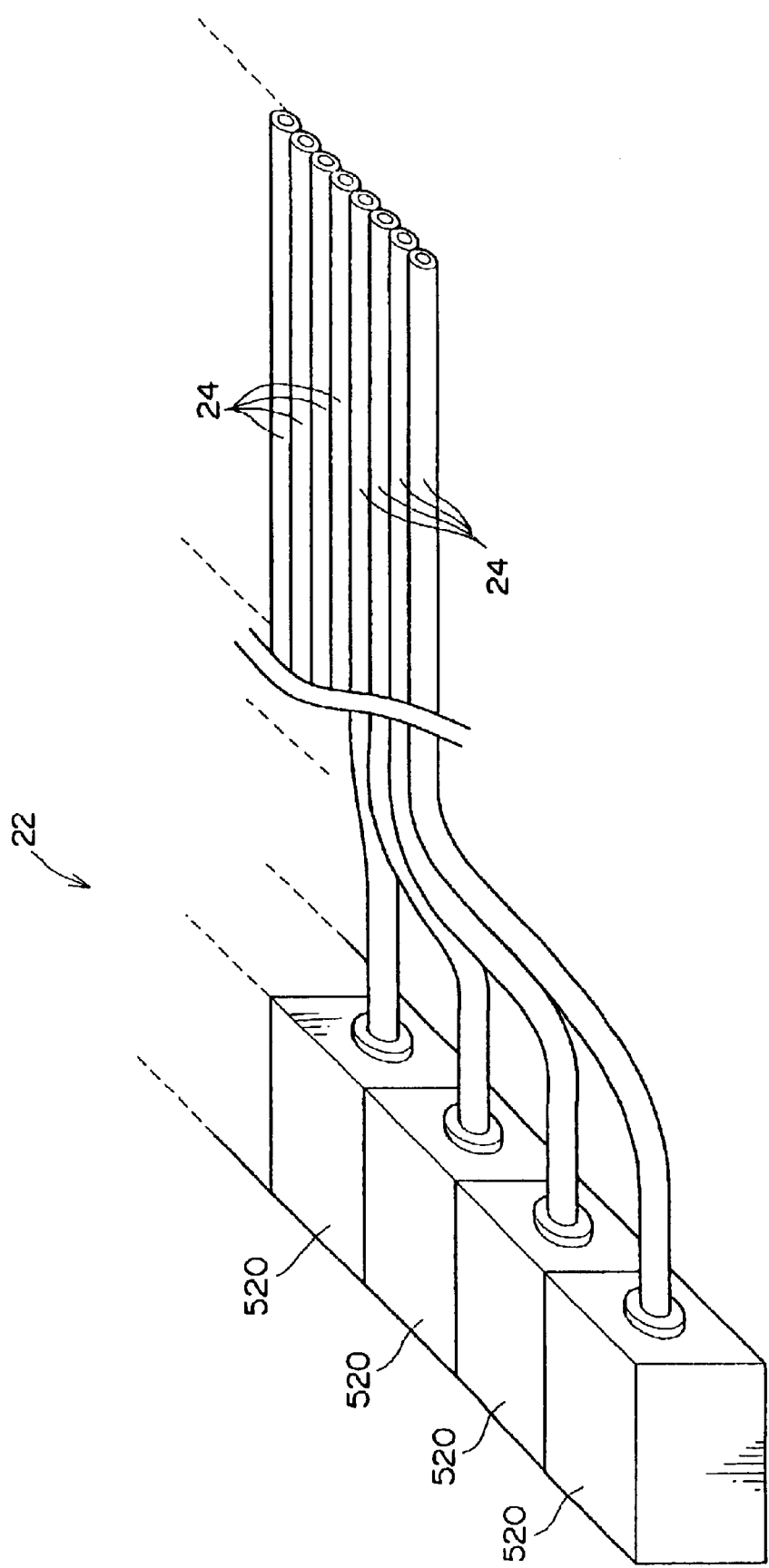
FIG. 23 is a perspective view showing a light source used for the fourth embodiment of the invention.

(5) A laser-beam source obtained by connecting a gallium-nitride-based-semiconductor laser to a fiber, a laser-beam source obtained by connecting a plurality of gallium-nitride-based-semiconductor lasers to fibers with a multiplexing optical system, a linear laser-beam source shown in FIG. 23 obtained by arranging the fibers like an array, and a flat laser-beam source obtained by arranging the fibers like a bundle.

(6) An ultraviolet-light source constituted by any one of the above laser-beam sources in Items (1) to (6) and a multiplexing optical system.

FIG. 7 shows a laminated structure of a GaN-based semiconductor laser having the light-emitting region of the broad area in the above Item (1). In the case of the GaN-based semiconductor laser having the laminated structure, an n-type $Ga_{1-z1}Al_{z1}N/GaN$ super-lattice clad layer 102 ($0.05<z1<1$), an n- or i-type GaN optical waveguide layer 104, an $In_{1-z2}Ga_{z2}N$(Si doped)/$In_{1-z3}Ga_{z3}N$ multi-quantum-well active layer 106 ($0.01<z2<0.05$, $0.1<z3<0.3$), a p-type $Ga_{0.8}Al_{0.2}N$ carrier blocking layer 108, an n- or i-type GaN optical-waveguide layer 110, a p-type $Ga_{1-z1}Al_{z1}N/GaN$ super-lattice clad layer 112, and a p-type GaN contact layer 114 are formed in order on an n-type GaN (0001) substrate 100. An insulating film 116 is formed on the p-type GaN contact layer 114 except a stripe region having a width of about 50 µm and a p-side electrode 118 is formed on the stripe region. Moreover, an n-side electrode 120 is formed on the back of the n-type GaN (0001) substrate 100. Because the semiconductor laser has an oscillation wavelength band of 440 nm and a light-emitting-region width of 50 µm, an obtained output is about 1 W and an electricity-light conversion efficiency is 15%. Laser beams supplied from 10 devices are input to a fiber having a core diameter of 500 µm to obtain a fiber-exciting module 122 having an output of 10 W.

FIG. 8 shows a semiconductor-laser-exciting solid-state laser for emitting a laser beam obtained by exciting slid-state laser crystal with the gallium-nitride-based-semiconductor laser in the above Item (2) by wavelength-converting the laser beam with a light-wavelength conversion device. The semiconductor-laser-exciting solid-state laser is provided with an exciting module 122 for emitting a laser beam 121 serving as exciting light, a fiber F whose incident end is optically-coupled with the exciting module 122, a condensing lens 124 for condensing the laser beam 121 serving as the divergent light emitted from the fiber F, a $LiYF_4$ crystal doped with $Pr^{3+}$ (hereafter referred to as Pr:YLF crystal) 126, a resonator mirror 128 set to the light-emission side of the Pr:YLF crystal 126, a light-wavelength conversion device 130 set between the Pr:YLF crystal 126 and resonator mirror 128, and an etalon 132.

The light-wavelength conversion device 130 is constituted by providing a cyclic-domain inversion structure for $LiNbO_3$ crystal doped with MgO serving as a nonlinear optical material. When assuming the wavelength of a basic wave as 720 nm and the wavelength of a second harmonic as 360 nm, the cycle of the cyclic-domain inversion structure is decided as 1.65 m so that the cycle serves as a primary cycle for the above wavelengths. Moreover, the etalon 132 serving as a wavelength selection device reduces noises by making a solid-state laser realize single longitudinal-mode oscillation.

The semiconductor laser 122 can use the broad-area type having an InGaN active layer and oscillating at a wavelength of 450 nm. Moreover, the end face 126a of the Pr:YLF crystal at the light-incoming side is provided with coating preferably passing the light having a wavelength of 450 nm at a transmittance of 80% or more but showing a high reflectance for a wavelength of 720 nm serving as one oscillation ray of $Pr^{3+}$ and a low reflectance for $Pr^{3+}$ oscillation rays of 400 to 650 nm and 800 nm or more other than 720 nm. Furthermore, the end face 126b of the Pr:YLF crystal at the light-outgoing side is provided with coating showing a low reflectance for a wavelength of 720 nm but showing a high reflectance for the second harmonic wavelength of 360 nm. Furthermore, the mirror face 128a of the resonator mirror 128 is provided with coating showing a high reflectance of the light having a wavelength of 720 nm, passing 95% or more of the light having a wavelength of 360 nm, and showing a low reflectance for the above light of 490 to 650 nm and 800 nm or more.

In the case of the semiconductor-laser-exciting solid-state laser, the laser beam 121 having a wavelength of 450 nm emitted from the semiconductor laser 122 passes through the end face 126a and enters the Pr:YLF crystal 126. The Pr:YLF crystal 126 emits the light having a wavelength of 720 nm because $Pr^{3+}$ is excited by the laser beam 121. The level in the above case is considered as $^3P_0 \to ^3F_4$. Moreover, laser oscillation is caused by a resonator constituted by the end face 126a of the Pr:YLF crystal and the mirror face 128a of the resonator mirror 128 and a solid-state laser beam 123 having a wavelength of 720 nm is obtained. The laser beam 123 enters the light-wavelength conversion device 130 and is converted into a second harmonic 125 having a ½ wavelength, that is, a wavelength of 360 nm. Because the mirror face 128a of the resonator mirror 128 is provided with the above-described coating, only the second harmonic 125 having a wavelength of about 360 nm is emitted from the resonator mirror 128.

FIG. 9 shows a fiber laser for emitting a laser beam obtained by exciting a fiber with the semiconductor laser for emitting the light in the infrared region described in the above Item (4) by wavelength-converting the laser beam with a light-wavelength conversion device. The fiber laser is a THG (third harmonic generation) fiber laser which is provided with a Q-switch-YVO$_4$ solid-state laser 134 for emitting a laser beam 133 having a wavelength of 1,064 nm, a collimating lens 136 for collimating the laser beam 133 serving as divergent light, a condensing lens 138 for condensing the collimated laser beam 133, a half mirror 142 set between the collimating lens 136 and the condensing lens 138, a fiber 140 having a core doped with $Nd^{3+}$, a condensing lens 154 for condensing the laser beam 133 emitted from the fiber 140, and a wavelength conversion section 156 for obtaining a wavelength-converted wave by receiving the condensed laser beam 133.

The wavelength conversion section 156 is constituted by an SHG (second harmonic generation) device 158 for converting the received laser beam 133 into a laser beam having a ½ wavelength (532 nm) and a THG (third harmonic generation) device 160 for converting the received laser beam 133 into a laser beam having a ⅓ wavelength (355 nm). Each of the SHG device 158 and THG device 160 is a bulk-type wavelength conversion crystal constituted by providing a cyclic-domain inversion structure for LiNbO$_3$ doped with MgO serving as a nonlinear optical material.

A semiconductor laser 144 for emitting a laser beam 135 having a wavelength of 809 nm is set to the reflected-light-incoming side of the half mirror 142 (below the half mirror 142 in FIG. 9). A collimating lens 146 is set between the half mirror 142 and the semiconductor laser 144.

As shown in FIG. 9, in the fiber 140, the laser beam 133 is amplified by receiving energy from the fluorescence having the same wavelength of 1,064 nm and emitted from the emission end face 140b of the fiber 140. The emitted laser beam 133 having the wavelength of 1,064 nm is condensed by the condensing lens 154 and enters the wavelength conversion section 156. The entered laser beam 133 is converted into a laser beam 137 of 355 nm serving as the third harmonic in the wavelength conversion section 156 and emitted. The THG fiber laser makes it possible to obtain an output of 5 W.

By constituting the wavelength conversion section by an SHG (second harmonic generation) device for converting an incoming laser beam into a laser beam having a ½ wavelength and an FHG (fourth harmonic generation) device for converting an incoming laser beam into a laser beam having a ¼ wavelength, it is possible to use the wavelength conversion section as an FHG (fourth harmonic generation) fiber laser.

Figure 11:
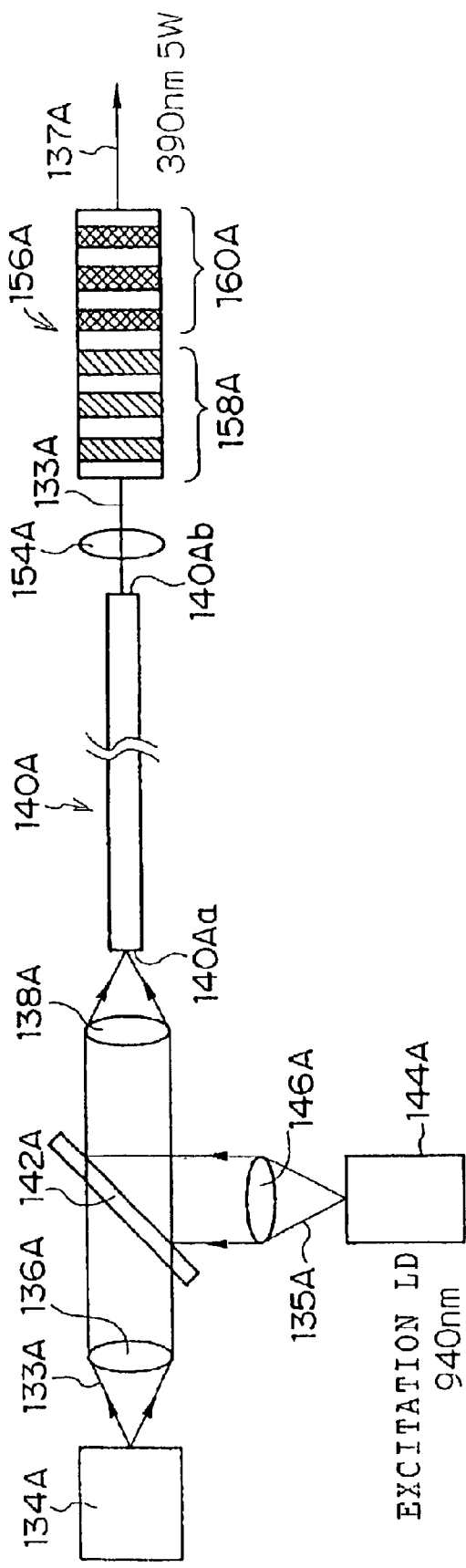
FIG. 11 is a schematic sectional view showing a configuration of an FHG (fourth-harmonic-generation) fiber laser, which can be used, as the ultraviolet light source of the laser sintering apparatus of the first embodiment of the invention.

As shown in FIG. 11, for example, an FHG fiber laser is constituted by a pulse-distribution feedback-type semiconductor laser (pulse DFB laser) 134A for emitting a laser beam 133A having a wavelength of 1,560 nm, a collimating lens 136A for collimating the laser beam 122A, a condensing lens 138A for condensing the collimated laser beam 133A, a fiber 140A having a core doped with $Er^{3+}$ and $Yb^{3+}$, a condensing lens 154A for condensing the laser beam 133A emitted from the fiber 140A, an SHG (second harmonic generation) device 158A for converting the incoming laser beam 133A into a laser beam having a ½ wavelength (780 nm), and an FHG (fourth harmonic generation) device 160A for converting the incoming laser beam 133A into a laser beam having a ¼ wavelength (390 nm).

Moreover, FIG. 10 shows a fiber laser for emitting a laser beam obtained by exciting a fiber with a fiber-input-exciting module using the gallium-nitride-based-semiconductor laser in the above Item (3) by wavelength-converting the laser beam with a light-wavelength conversion device. The fiber laser is an SHG (second harmonic generation) fiber laser which is provided with a fiber-input-exciting module 174 using a GaN-based semiconductor laser for emitting a laser beam 173 having a wavelength of 450 nm, a collimating lens 176 for collimating the laser beam 173 serving as divergent light, a condensing lens 178 for condensing the collimated laser beam 173, a fiber 180 having a core doped with $Pr^{3+}$, a condensing lens 194 for condensing a laser beam having a wavelength of 720 nm emitted from the fiber 180, and an SHG (second harmonic generation) device 196 for receiving a condensed laser beam 182 and converting the laser beam 182 into a laser beam 177 having a ½ wavelength (360 nm). The SHG device 196 is a bulk-type wavelength-conversion crystal constituted by providing a cyclic-domain inversion structure for LiNbO$_3$ doped with MgO. End faces 180a and 180b of the fiber 180 are provided with a coat having a characteristic that the coat functions as an AR (antireflection) film to the light of each of the above wavelengths.

In the case of the fiber laser, the laser beam 173 having the wavelength of 450 nm emitted from the fiber-input-exciting module 174 using a GaN-based semiconductor laser is condensed by the condensing lens 178 and enters the fiber 180. Fluorescence having a wavelength of 720 nm is generated by the entered laser beam 173 and resonated between the both end faces 180a and 180b of the fiber 180, and the laser beam 182 having the wavelength of 720 nm is emitted from the emission end face 180b. The emitted laser beam 182 having the wavelength of 720 nm is condensed by the condensing lens 194 and enters the SHG device 196. The entered laser beam 182 is converted into the laser beam 177 of 360 nm serving as the second harmonic by and emitted from the SHG device 196.

The above configuration uses the DMD 28 as a spatial light modulator and fixes the reflection mirror 32. However, the invention is not restricted to the above configuration. For example, the reflection mirror 32 is made rotatable toward X-axis direction by using a GLV as a spatial light modulator. In accordance with the above configuration, it is possible to expose a predetermined region at a decided position by deciding the position of the exposure unit 18 by the XY-positioning mechanism 20, then simultaneously exposing line segments having predetermined lengths in Y-axis direction by the GLV, and exposing line segments having predetermined lengths in X-axis direction in accordance with a very slight rotation of the reflection mirror 32. Thus, because a predetermined region can be exposed without moving the XY-positioning mechanism 20, it is possible to realize high-speed very-minute forming.

It is possible to use a continuously or pulse-driven laser beam in a predetermined region including ultraviolet as a light source. When using a pulse-driven laser beam as a light source, it is allowed to pulse-drive a gallium-nitride-based-semiconductor laser having a high COD level by pulse-operating a driving current or pulse-drive the semiconductor laser by a Q switch, more preferably in accordance with the mode-locking operation having a high repetitive frequency (e.g. 100 MHz). By using a pulse-driven laser beam as a light source, heat diffusion is prevented and thereby, high-speed very-minute forming is realized. Therefore, a pulse-driven laser beam having a smaller pulse width is suitable. It is preferable to use a pulse width of 1 psec to 100 nsec and more preferable to use a pulse width of 1 to 300 psec. Particularly, the pulse width of 1 to 300 psec can be easily realized in the case of a GaN-LD having a high COD and moreover, the pulse width can be easily realized by making a solid-state laser or a fiber laser including a rare-earth element having a large light-emitting-spectrum width such as $Pr^{3+}$, $Er^{3+}$, or $Yb^{3+}$ shown for this embodiment perform the mode-locking operation.

(Second Embodiment)

Figure 12:
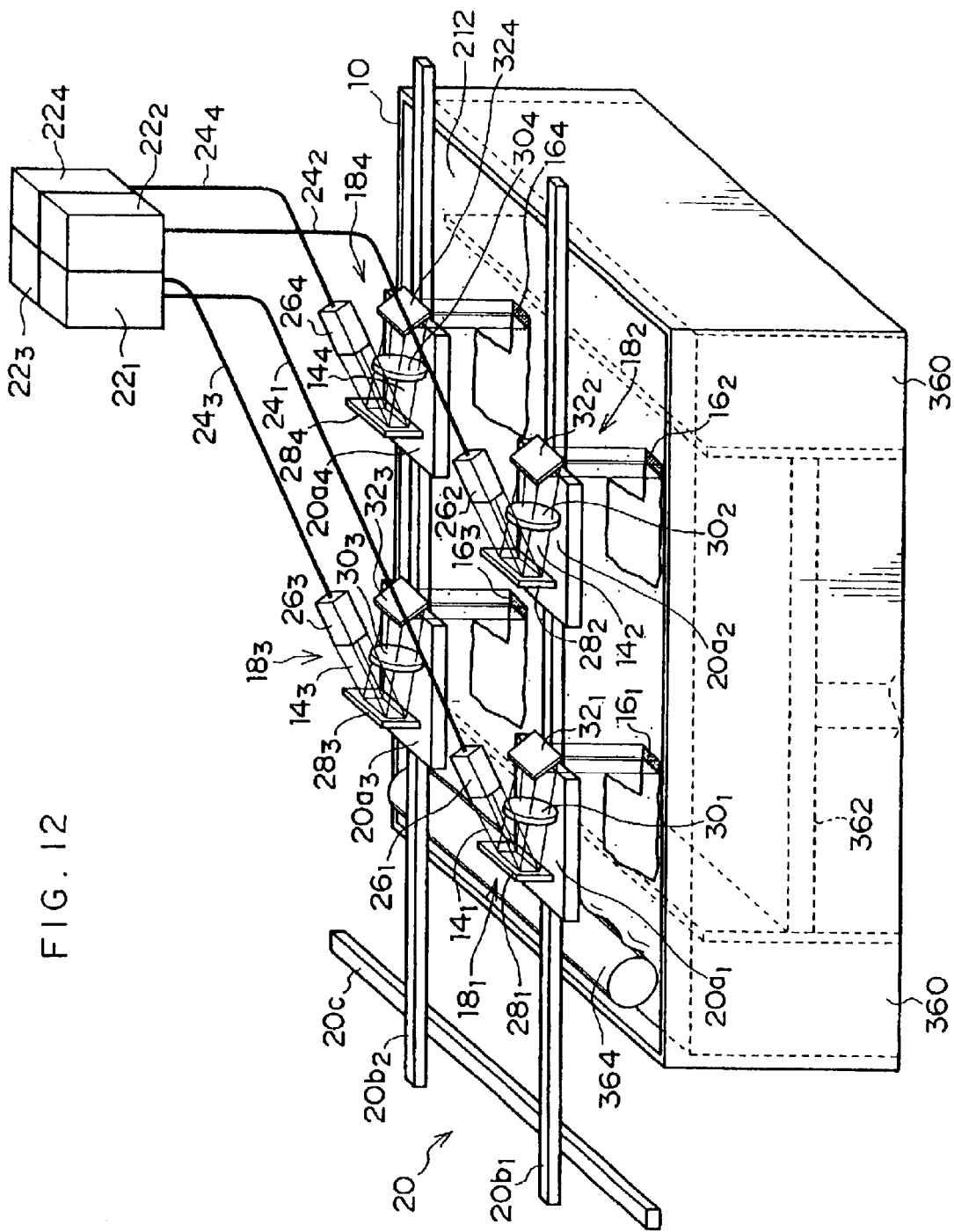
FIG. 12 is a perspective view showing a schematic configuration of a laser sintering apparatus of second embodiment of the invention.

As shown in FIG. 12, the laser sintering apparatus of the second embodiment of the invention has the same configuration as the laser sintering apparatus of the first embodiment except that a plurality of exposure units and a plurality of light sources are used. Therefore, the same parts are provided with the same symbol and their description is omitted.

In the case of the laser sintering apparatus of the second embodiment, four exposure units $18_1$, $18_2$, $18_3$, and $18_4$ are arranged above the surface of a powdered body 212 set on a part cylinder 362. It is possible to mutually independently move the exposure units $18_1$, $18_2$, $18_3$, and $18_4$ by an XY-positioning mechanism 20 in the direction horizontal to the surface of the powdered body (XY directions).

The XY-positioning mechanism 20 is constituted by fixing tables $20a_1$ to $20a_4$ for fixing the exposure units $18_1$ to $18_4$ respectively, a supporting body $20b_1$ for supporting the fixing tables $20a_1$ and $20a_2$ movably in the X direction, a supporting body $20b_2$ for supporting the fixing tables $20a_3$ and $20a_4$ movably in the X direction, and a supporting body 20c for supporting the supporting bodies $20b_1$ and $20b_2$ movably in the Y direction together with the fixing tables $20a_1$ to $20a_4$.

The exposure units $18_1$ to $18_4$ are provided with homogenizer optical systems $26_1$ to $26_4$ serving as shaping optical systems for collimating laser beams $14_1$ to $14_4$ in predetermined wavelength regions including ultraviolet incoming from corresponding ultraviolet light sources $22_1$ to $22_4$ through corresponding optical fibers $24_1$ to $24_4$ and shaping the waveforms of the collimated laser beams $14_1$ to $14_4$ and converting the intensity distribution in a plane vertical to the optical axis into rectangle, digital micromirror devices (DMDs) $28_1$ to $28_4$ for modulating laser beams incoming from the homogenizer optical systems $26_1$ to $26_4$ every pixel in accordance with image data, condensing lenses $30_1$ to $30_4$ for condensing laser beams incoming from the DMDs $28_1$ to $28_4$, and fixed reflection mirrors $32_1$ to $32_4$ for reflecting laser beams passing through the condensing lenses $30_1$ to $30_4$ in the direction of the surface of the powdered body 212.

The XY-positioning mechanism 20, ultraviolet light sources $22_1$ to $22_4$, and DMDs $28_1$ to $28_4$ are connected to a controller (not illustrated) for controlling them.

Operations of the above-described laser sintering apparatus are described below. The XY-positioning mechanism 20 is driven by a controller (not illustrated), the exposure units $18_1$ to $18_4$ are moved in the X and Y directions, and the first positions of the exposure units $18_1$ to $18_4$ in the X and Y directions are decided. When the first positions of the exposure units $18_1$ to $18_4$ are decided, regions $16_1$ to $16_4$ having predetermined areas on the surface of the powdered body 212 are exposed by respectively-corresponding laser beams $14_1$ to $14_4$ in predetermined wavelength regions including ultraviolet and portions in the regions $16_1$ to $16_4$ exposed by the laser beams are cured.

When exposure of the regions $16_1$ to $16_4$ having predetermined areas at the first positions are completed, the exposure units $18_1$ to $18_4$ are moved by the XY-positioning mechanism 20 in the X and Y directions, second positions of the exposure units $18_1$ to $18_4$ in the X and Y directions are decided, and the regions $16_1$ to $16_4$ having predetermined areas corresponding to the second positions are exposed similarly to the above described. Thus, by repeating movement and exposure of the exposure units $18_1$ to $18_4$, it is possible to expose the entire surface of the powdered body 212.

As described above, the laser sintering apparatus of this embodiment is provided with a plurality of exposure units having DMDs and thereby, it is possible to simultaneously expose regions having predetermined areas of exposure units. Therefore, forming at a higher speed is realized compared to the case of the first embodiment. For example, when using four exposure units, it is possible to perform forming at a speed four times higher than the case of using one exposure unit.

Moreover, when performing exposure with a plurality of exposure units, it is possible to suppress the generation of distortions due to local curing and contraction and moreover, it is possible to continue laser sintering by using normal exposure units even if some of exposure units are broken. Therefore, using a plurality of exposure units is superior in use stability.

For the above second embodiment, a case is described in which four exposure units are used. However, the number of exposure units is properly decided in accordance with the size of a part cylinder and requested forming speed and forming accuracy. Moreover, it is allowed to constitute an ultraviolet light source by any one of the above Items (1) to (6).

The above configuration uses the DMD 28 as a spatial light modulator and fixes the reflection mirror 32. However, the invention is not restricted to the above configuration. For example, it is possible to use a GLV as a spatial light modulator and make the reflection mirror 32 rotatable toward the X-axis direction. In accordance with this configuration, it is possible to expose a predetermined region at a decided position by deciding the position of the exposure unit 18 by the XY-positioning mechanism 20 and then, simultaneously expose line segments having predetermined lengths in the X-axis direction in accordance with a slight rotation of the reflection mirror 32. Therefore, it is possible to realize higher-speed more-minute forming because a predetermined region can be exposed without moving the XY-positioning mechanism 20.

(Third Embodiment)

Figure 13:
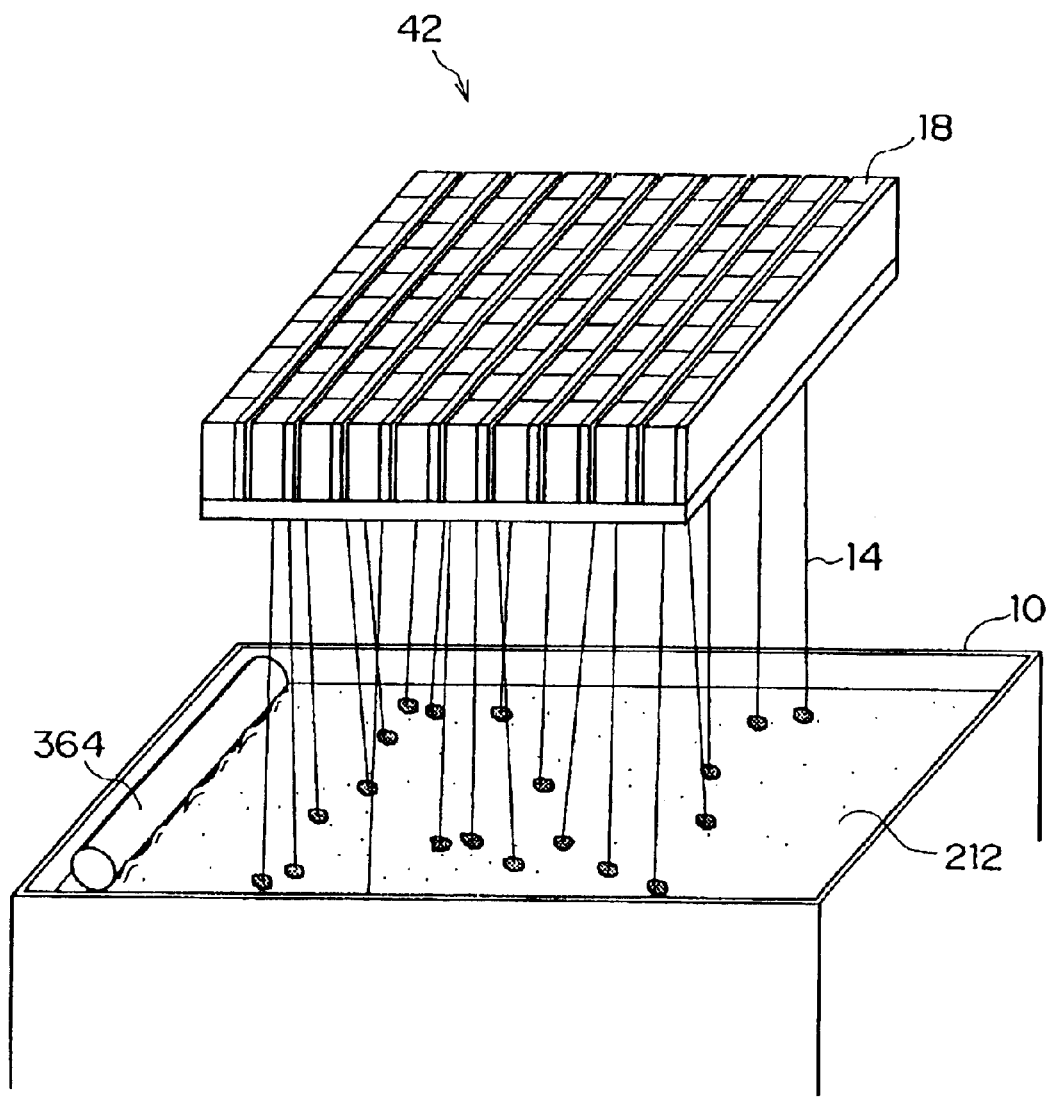
FIG. 13 is a perspective view showing a schematic configuration of a laser sintering apparatus of third embodiment of the invention.

FIG. 13 shows the laser sintering apparatus of the third embodiment of the invention. The laser sintering apparatus is provided with a not-illustrated part cylinder and a powdered body 212 is set on the part cylinder. An exposure head 42 is fixed by a fixing component (not illustrated) above the surface of the powdered body 212 set on the part cylinder. Many exposure units 18 (100 exposure units in FIG. 13) for scanning and exposing regions having predetermined areas corresponding to a plurality of pixels on the surface of a powdered body with a laser beam 14 in a predetermined wavelength region including ultraviolet are arranged on the exposure head 42 like an array (10 columns×10 rows).

Figure 14A:
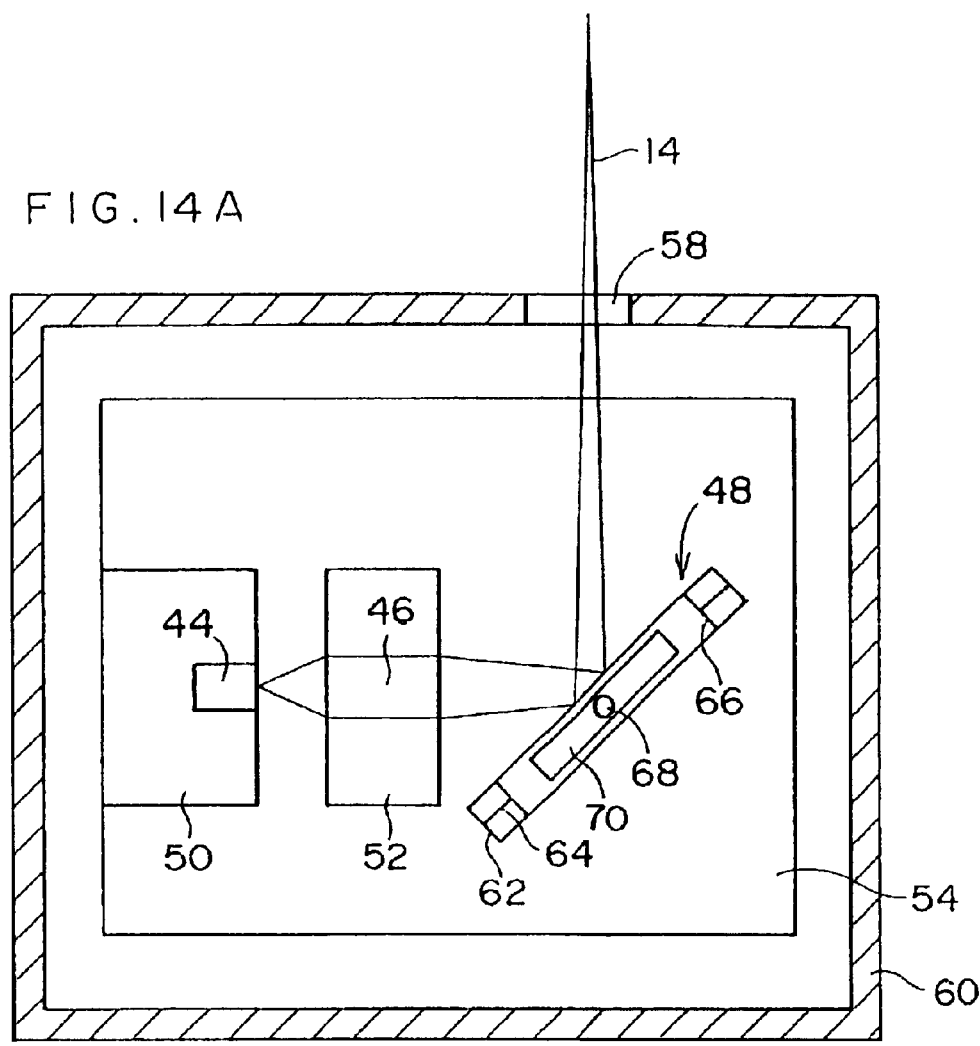
FIG. 14A is a top view showing a configuration of an exposure unit of the laser sintering apparatus of the third embodiment of the invention.
Figure 14B:
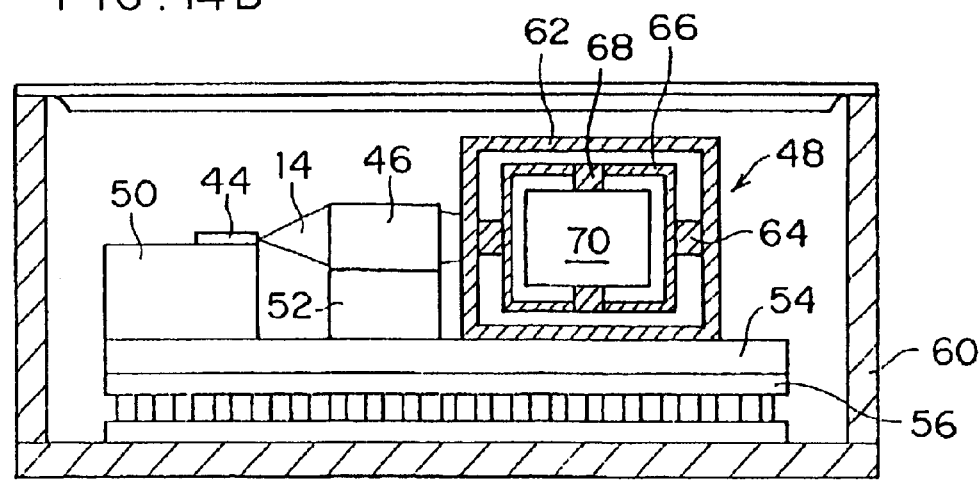
FIG. 14B is a sectional view along the optical axis in FIG. 14A.

As shown in FIGS. 14A and 14B, the exposure units 18 are respectively provided with a GaN semiconductor laser 44 serving as a light source in a predetermined wavelength region including ultraviolet, a condensing lens 46 constituted by, for example, a refractive-index-distribution-type lens for condensing a laser beam emitted from the GaN semiconductor laser 44, and a two-dimensional microscanner 48 for reflecting the laser beam condensed by the condensing lens 46 and focusing the laser beam on the surface of the powdered body 212.

Figure 15A:
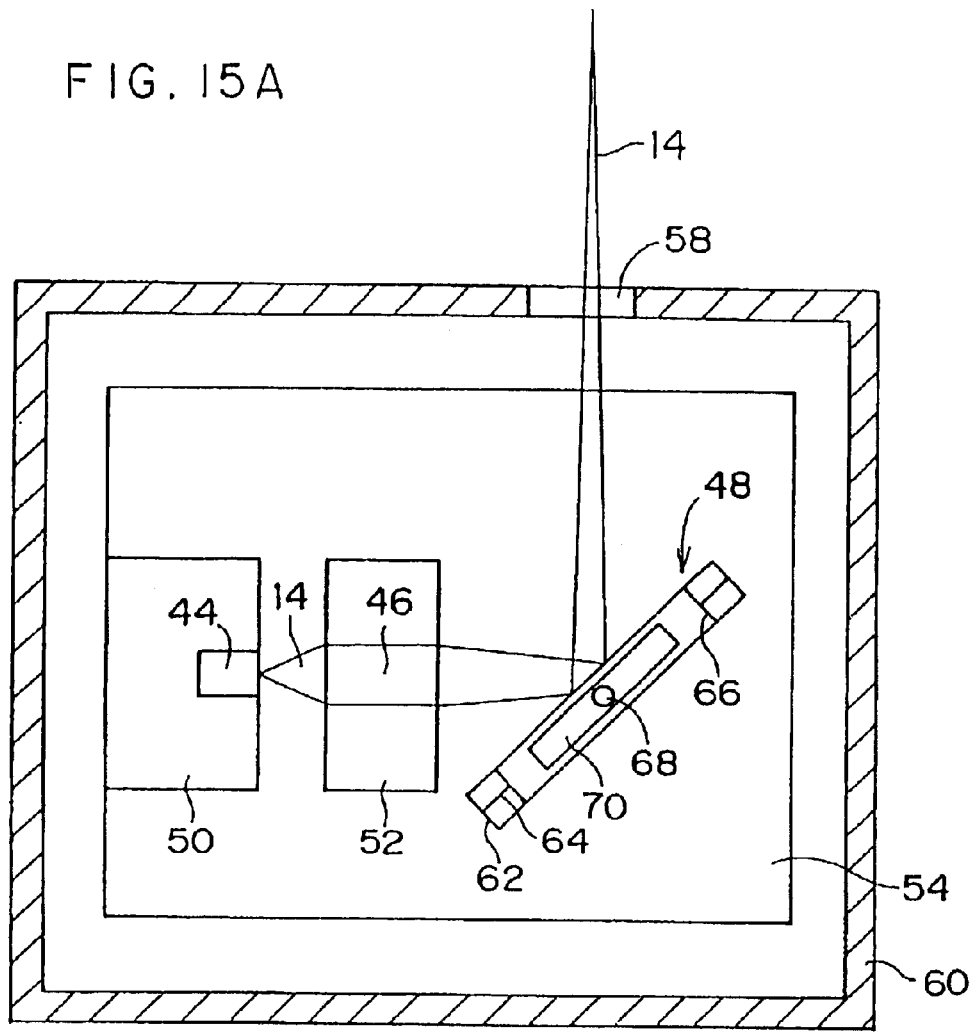
FIG. 15A is a top view showing a modification of the exposure unit of the laser sintering apparatus of the third embodiment of the invention.
Figure 15B:
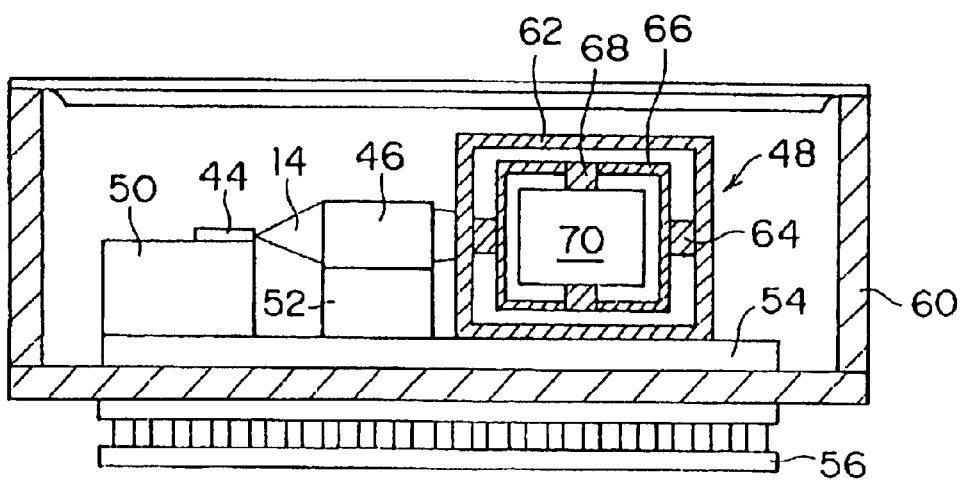
FIG. 15B is a sectional view along the optical axis in FIG. 15A.

The gallium-nitride-based-semiconductor laser 44 and condensing lens 46 are set to a common substrate 54 together with the two-dimensional microscanner 48 while they are held by mounts 50 and 52 made of copper or silicon. The substrate 54 in which various components are fixed is fixed on a Peltier device 56 constituting a temperature-adjusting component and air-tightly sealed in a package 60 having a light emission window 58. A thermistor (not illustrated) is set in the package 60, driving of the Peltier device 56 is controlled by a temperature control circuit (not illustrated) in accordance with a temperature detection signal output from the thermistor and all elements in the package 60 are controlled to a common predetermined temperature. As shown in FIG. 15B, it is also allowed that the Peltier device 56 is set outside of the package 60.

The two-dimensional microscanner 48 is constituted by an external frame 62 fixed to the substrate 54, an internal frame 66 held by the external frame so as to be rotatable about a rotary shaft 64, and a reflection mirror 70 held by the internal frame 66 so as to be rotatable about the rotary shaft 68. The exposure units 18 are arranged on an exposure head so that a laser beam reflected from the reflection mirror 70 scans regions on the surface of a powdered body in the X and Y directions.

The gallium-nitride-based-semiconductor laser 44 and two-dimensional microscanner 48 of each exposure unit 18 are connected to a controller (not illustrated) for independently controlling the laser 44 and microscanner 48.

Then, operations of the laser sintering apparatus described above are described below. The gallium-nitride-based laser 44 of each exposure unit 18 is independently driven by a controller (not illustrated), a laser beam is emitted from the gallium-nitride-based-semiconductor laser 44, and image data in a region having a predetermined area corresponding to the set position of each exposure unit 18 is transmitted to a controller (not illustrated) of the two-dimensional microscanner 48. In the case of the two-dimensional microscanner 48, the reflection mirror 70 held by the internal frame 66 rotates about the rotary shaft 68 and regions are scanned with the laser beam 14 in the X direction, the internal frame 66 held by the external frame 62 rotates about the rotary shaft 64 together with the reflection mirror 70, regions are scanned with the laser beam 14 in the Y direction orthogonal to the X direction, a region having a predetermined area corresponding to each exposure unit 18 is exposed, and resultantly the entire surface of the powdered body 212 is exposed.

For example, when assuming the spot diameter of a laser beam on the surface of the powdered body 212 as 50 $\mu$m, it is possible to simultaneously expose regions respectively having an area of 50 mm×50 mm by using the exposure units 18 respectively provided with the two-dimensional microscanner 48 of one million (1,000×1,000) pixels. In this case, when assuming the total exposure area on the surface of the powdered body 212 as 500 mm×500 mm, it is possible to expose the entire surface of the powdered body 212 in a short time by simultaneously exposing regions with 100 exposure units 18. That is, when exposing the entire surface with 100 exposure units 18, the exposure region per exposure unit is decreased to $\frac{1}{100}$ the case of exposing the entire surface with one exposure unit 18 and the exposure time is also decreased to $\frac{1}{100}$.

As described above, in the case of the laser sintering apparatus of this embodiment, an exposure unit is downsized compared to the case of using a conventional movable mirror by using a two-dimensional microscanner for scanning with a laser beam modulated every pixel in accordance with image data. Therefore, it is possible to arrange many exposure units on an exposure head, scan and expose regions respectively having a predetermined area with many exposure units in parallel, and high-speed very-minute forming is realized. Moreover, because the whole region is exposed with many exposure units, it is possible to limit the area of a region to be scanned and exposed with one exposure unit and decrease the number of pin cushion errors to about $\frac{1}{10}$ when using, for example, 100 exposure units.

Moreover, an ultraviolet light source constituted by a gallium-nitride-based semiconductor laser has a high output and a low cost. Therefore, it is possible to reduce the whole fabrication cost of a laser sintering apparatus. Particularly, when comparing the above laser sintering apparatus with a conventional laser sintering apparatus using a gas laser such as a YAG laser or $CO_2$ laser or a solid-state laser, there are advantages that the former laser is inexpensive and easily maintained, and the whole apparatus is downsized.

For the above third embodiment, a case is described in which 100 exposure units are used. However, the number of exposure units is properly decided in accordance with the size of a part cylinder in which a powdered body is set, or requested forming speed or forming accuracy. It is preferable that the number of exposure units ranges between 25 and 100.

Moreover, in the case of the above third embodiment, a case is described in which an ultraviolet light source is constituted by a gallium-nitride-based semiconductor laser. However, it is also allowed to constitute a light source in a predetermined wavelength region including ultraviolet by any one of the above Items (1) to (6) similarly to the case of the first embodiment.

Figure 16A:
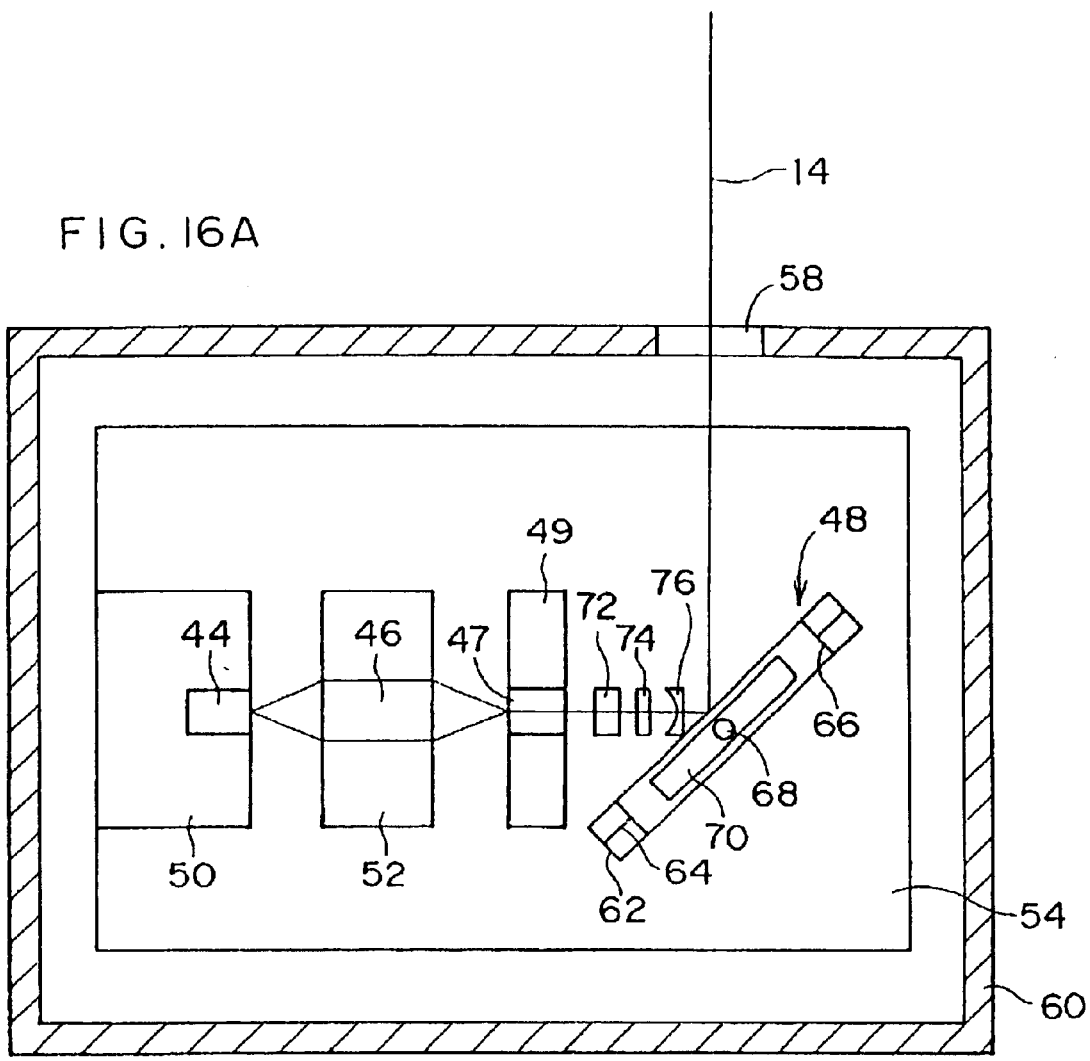
FIG. 16A is a top view showing a modification of the exposure unit of the laser sintering apparatus of the third embodiment of the invention.
Figure 16B:
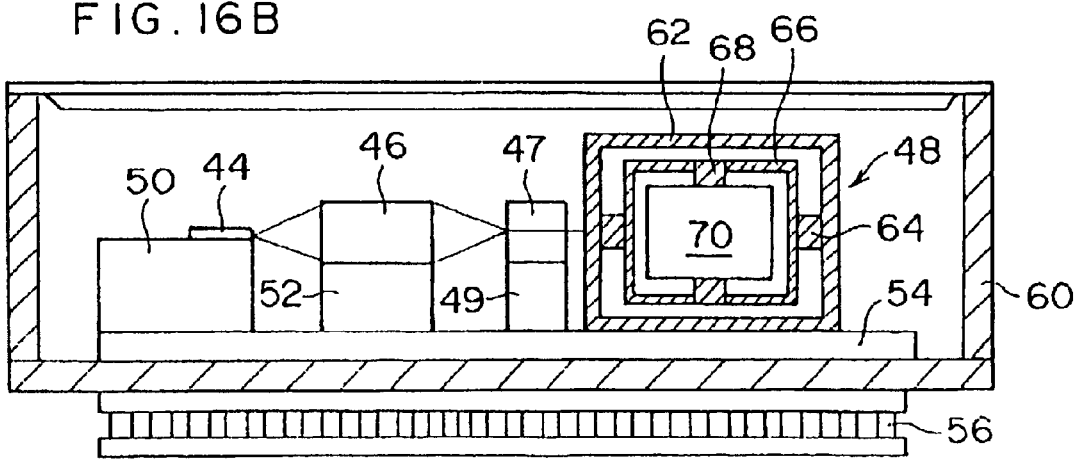
FIG. 16B is a sectional view along the optical axis in FIG. 16A.

FIGS. 16A and 16B show a configuration of an exposure unit when using the semiconductor-laser-exciting solid-state laser in the (2). A component same as that of the exposure unit of the third embodiment is provided with the same symbol and its description is omitted. In the case of this exposure unit, a $LiYF_4$ crystal doped with $Pr^{3+}$ (hereafter referred to as Pr:YL crystal) 47 serving as a solid-state laser medium is set between the condensing lens 46 and two-dimensional microscanner 48 and set to the common substrate 54 while the crystal 47 is held by a mount 49 made of, for example, copper. Moreover, a wavelength conversion device 72, an etalon 74, and a resonator mirror 76 are arranged in order between the Pr:YLF crystal 47 and two-dimensional microscanner 48 while they are respectively held by a mount (not illustrated). Furthermore, the Peltier device 56 is set to the outside of the package 60. The configuration of the light-wavelength conversion device 72, semiconductor laser 44, and resonator mirror 76 is the same as that of the semiconductor-laser-exciting solid-state laser shown in FIG. 8.

In the case of the semiconductor-laser-exciting solid-state laser, $Pr^{3+}$ of the Pr:YLF crystal 47 is excited by a laser beam incoming from the semiconductor laser 44 and a laser beam having a predetermined wavelength is emitted from the Pr:YLF crystal 47. The emitted laser beam is resonated by a resonator constituted by the end face of the Pr:YLF crystal 47 and the mirror face of the resonator mirror 76, wavelength-converted by the light-wavelength conversion device 72, and emitted as a laser beam 14.

Figure 17A:
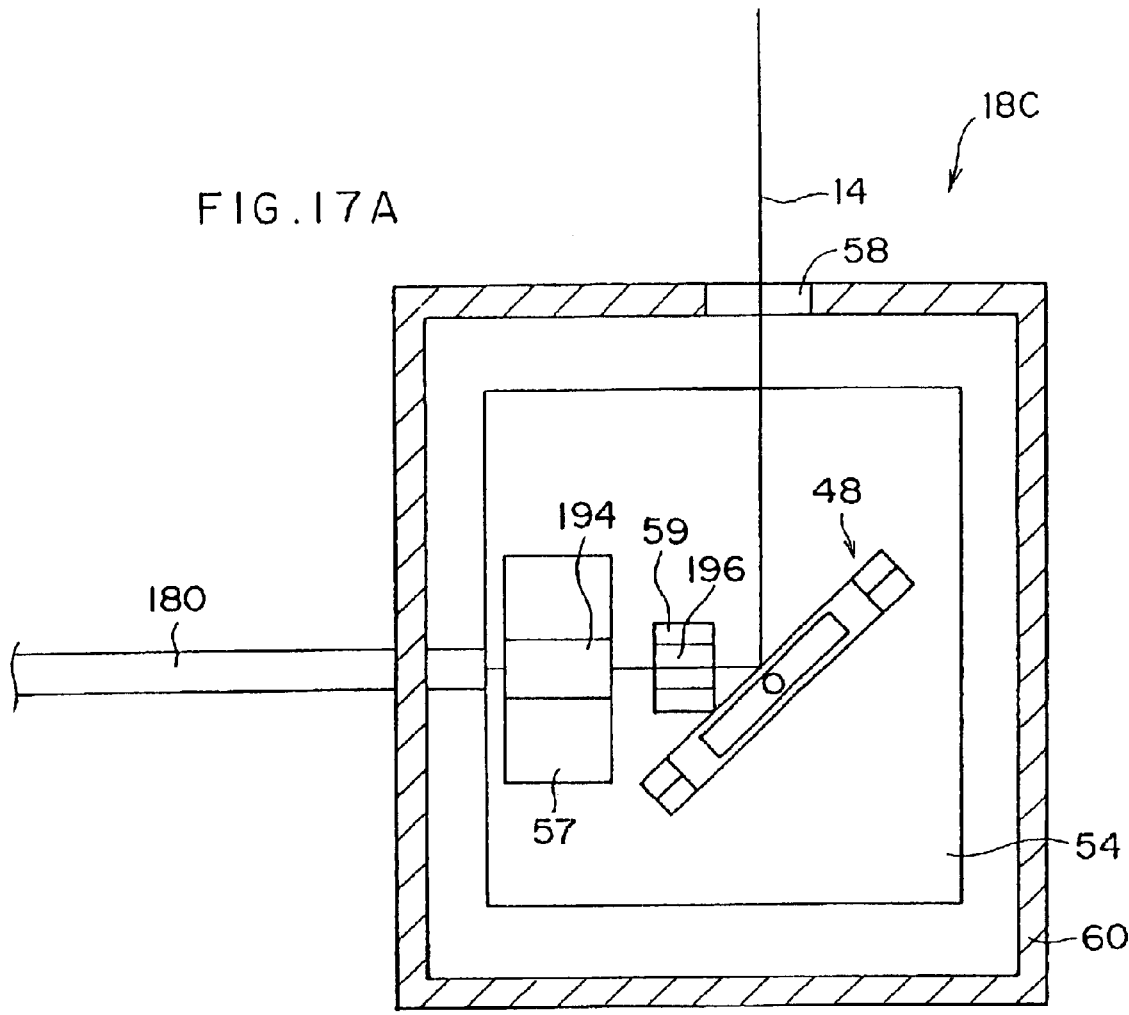
FIG. 17A is a top view showing a modification of the exposure unit of the laser sintering apparatus of the third embodiment of the invention.
Figure 17B:
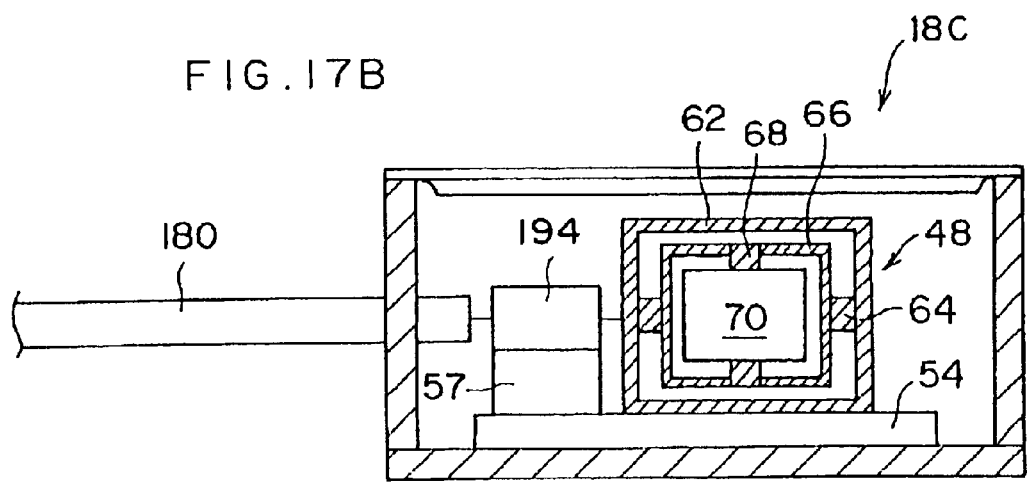
FIG. 17B is a sectional view along the optical axis in FIG. 17A.
Figure 18:
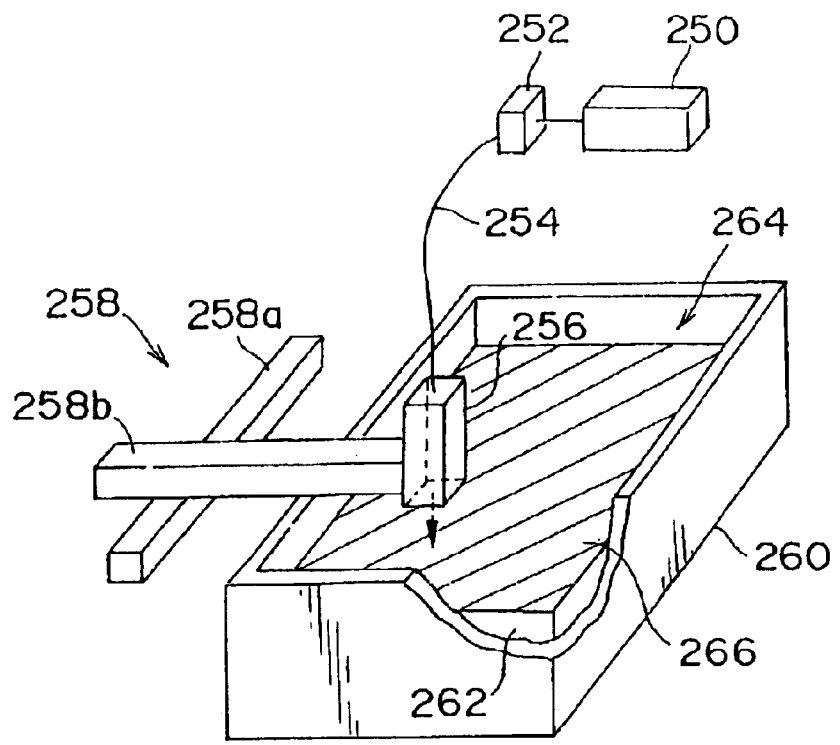
FIG. 18 is a perspective view showing a configuration of a conventional laser sintering apparatus according to a laser scanning system.
Figure 19:
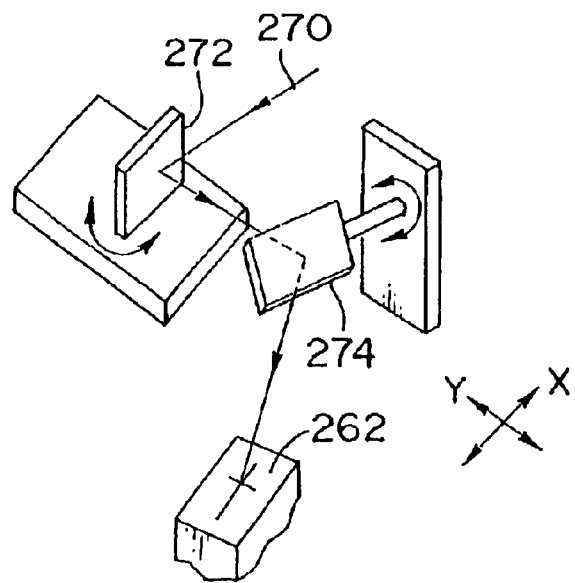
FIG. 19 is a perspective view showing a configuration of a conventional laser sintering apparatus according to a movable mirror system.

FIGS. 17A and 17B show a configuration of an exposure unit when using a fiber laser for emitting a laser beam obtained by exciting a fiber with the gallium-nitride-based semiconductor laser shown in FIG. 10 by wavelength-converting the laser beam with a light-wavelength conversion device. A component same as the exposure units of the third embodiment is provided with the same symbol and its description is omitted. The exposure unit is provided with a fiber laser and a two-dimensional microscanner 48 for reflecting a laser beam 177 emitted from the fiber laser in the two-dimensional direction and focusing the laser beam passing through a condensing lens 194 on the surface of the powdered body 212.

As shown in FIG. 10, the fiber laser is provided with a GaN-based semiconductor laser 174 for emitting a laser beam 173 having a wavelength of 450 nm, a collimating lens 176 for collimating the laser beam 173 serving as divergent light, a condensing lens 178 for condensing the collimated laser beam 173, a fiber 180 having a core doped with $Pr^{3+}$, a condensing lens 194 for condensing a laser beam 182 having a wavelength of 720 nm emitted from the fiber 180, and an SHG (second harmonic generation) device 196 for receiving the condensed laser beam 182 and converting it into a laser beam 177 having a ½ wavelength (360 nm).

The condensing lens 194 and SHG device 196 are arranged inside of the package 60 and set to the common substrate 54 together with the two-dimensional microscanner 48 while they are held by mounts 57 and 59 respectively made of, for example, copper. The substrate 54 in which components are fixed is airtightly sealed in the package 60 having the light-emission window 58. The end of the fiber 180 at the emission side is passes through the sidewall of the package 60 and is introduced into the package 60 and optically coupled with the condensing lens 194. Other components shown in FIG. 10 though not illustrated in FIGS. 17A and 17B are set outside of the package 60.

Moreover, for the exposure unit shown in FIGS. 17A and 17B, it is possible to use the fiber laser shown in FIG. 9 for emitting a laser beam obtained by exciting a fiber with a semiconductor laser for emitting the light in the infrared region by wavelength-converting the laser beam with a light-wavelength conversion device instead of the fiber laser shown in FIG. 10.

As shown in FIG. 9, the fiber laser can also use a Q-switch $YVO_4$ solid-state laser 134 for emitting a laser beam 133 having a wavelength of 1,064 nm (or can use an InGaAs-based semiconductor laser having a window structure and in this case, a pulse width can be set to the psec order and high-repetitive operation (10 MHz) is possible), which is provided with a collimating lens 136 for collimating the laser beam 133 serving as divergent light, a condensing lens 138 for condensing the collimated laser beam 133, a half mirror 142 set between the collimating lens 136 and the condensing lens 138, a fiber 140 having a core doped with $Nd^{3+}$, a condensing lens 154 for condensing the laser beam 133 emitted from the fiber 140, and a wavelength conversion section 156 for receiving the condensed laser beam 133 to obtain a wavelength conversion wave. The wavelength conversion section 156 is constituted by an SHG (second harmonic generation) device 158 for converting the received laser beam 133 into a laser beam having a ½ wavelength (532 nm) and a THG (third harmonic generation) device 160 for converting the received laser beam 133 into a laser beam having a ⅓ wavelength (355 nm).

In this case, the condensing lens 154, SHG device 158, and THG device 160 are arranged in a package while they are respectively held by a mount, set to a common substrate together with a two-dimensional microscanner, and airtightly sealed in the package. The end of the fiber 140 at the emission side passes through the sidewall of the package and is introduced into the inside and optically coupled with the condensing lens 154.

(Fourth Embodiment)

FIG. 20 shows the laser sintering apparatus of the fourth embodiment of the invention. Because the optical forming apparatus of the fourth embodiment has almost the same configuration as the optical forming apparatus of the first embodiment, the same portion is provided with the same symbol and its description is omitted.

As shown in FIGS. 1 and 2, the exposure unit 18 of the laser sintering apparatus of the first embodiment uses the laser beam 14 in the predetermined wavelength region including ultraviolet incoming from the light source 22 for emitting a laser beam in a predetermined wavelength region including ultraviolet through the optical fiber 24 bundled into an array. However, the exposure unit 18B of the laser sintering apparatus of the fourth embodiment uses a laser beam in a predetermined wavelength region including ultraviolet by a high-output light source.

FIG. 23 shows details of the light source 22. The light source 22 is constituted by semiconductor-laser-multiplexing modules 520 for multiplexing beams output from a plurality of semiconductor laser chips into one fiber and optical fibers 24 optically coupled with the semiconductor-laser-multiplexing modules 520 and arranged like an array so that a linear laser beam flux is emitted. As shown in FIGS. 22A and 22B, each semiconductor laser chip 520 is constituted by a plurality of transversal-multimode gallium-nitride-based semiconductor lasers 530 (e.g. seven lasers) arranged and fixed on a heat sink 510, collimator lenses 540 set to the semiconductor lasers 530 so as to be faced each other respectively, and a condensing lens 550 and optically coupled with a multimode optical fiber 24.

The heat sink 510, semiconductor lasers 530, and the collimator lenses 540 are housed in a boxy package 580 whose upper portion opens. When the opening of the package 580 is closed by a package lid 581, the package 580 and package lid 581 are hermetically held in a closed space.

A base plate 590 is fixed to the bottom of the package 580 and the heat-sink block 510 is set to the upper face of the base plate 590. Moreover, a collimator-lens holder 541 for holding the collimator lenses 540 is fixed to the heat-sink block 510. Furthermore, a condensing-lens holder 551 for holding the holding lens 550 and a fiber holder 552 for holding the incident end of the multimode optical fiber 24 are fixed to the upper face of the base plate 590. Furthermore, a wiring 555 and the like for supplying a driving current to the gallium-nitride-based semiconductor lasers 530 are sealed with a not-illustrated airtight sealing material formed on the sidewall of the package 580 and extended to the outside of the package.

The collimator lenses 540 are respectively formed so that opening diameters of the gallium-nitride-based semiconductor lasers 530 in the arrangement direction of light-emitting points of the lasers 530 are smaller than the opening diameter in the direction vertical to the arrangement direction (that is, they are respectively formed as a slender shape) and closely arranged in the arrangement direction of the light-emitting points. The gallium-nitride-based semiconductor lasers 530 respectively use a laser for emitting a laser beam while having a light-emitting width of 2 μm and broadening angles of 10° and 30° in the directions parallel with and vertical to an active layer. These gallium-nitride-based semiconductor lasers 530 are arranged so that the light-emitting points are lined up in the direction parallel with the active layer.

Therefore, laser beams emitted from the light-emitting points enter the collimator lenses 540 while the direction of the maximum broadening angle coincides with the direction of a large opening diameter and the direction of the minimum broadening angle coincides with the direction of a small opening diameter. That is, each slender collimator lens 540 is used by minimizing non-effective portions correspondingly to elliptic sectional shape of an incoming laser beam.

For example, in the case of this embodiment, it is possible to use horizontal- and vertical-directional opening diameters of 1.1 mm and 4.6 mm, a focal distance of 3 mm, and an NA of 0.6 of each collimator lens 540 and beam diameters of 0.9 mm and 2.6 mm of a laser beam incoming into each collimator lens 540 in the horizontal and vertical directions. Moreover, the collimator lenses 540 are arranged at a pitch of 1.25 mm.

The condensing lens 550 is formed into a shape, which is long in the arrangement direction of the collimator lenses 540, that is, long in the horizontal direction and short in the vertical direction, by cutting out a region including the optical axis of an aspherical lens. The condensing lens 550 can use a lens having a focal distance of 12.5 mm and an NA of 0.3. The condensing lens 550 is also formed by molding a resin or optical glass.

However, the multimode optical fiber 24 can use a fiber having whose core center is the graded index type and whose circumference is the step index type and which has a core diameter of 25 μm, an NA of 0.3, and an end-face-coating transmission factor of 99.5% or more. That is, the value of core diameter×NA is equal to 7.5 μm.

When a coupling efficiency of a laser beam with the multimode optical fiber 24 is 0.9 and an output of each gallium-nitride-based semiconductor laser 530 is 100 mW, and the number of gallium-nitride-based semiconductor lasers 530 is 7, a multiplexed laser beam having an output of 630 mW (=100 mW×0.9×7) is obtained.

The gallium-nitride-based semiconductor lasers 530 respectively have an oscillation wavelength of 405±10 nm and the maximum output of 100 mW. Laser beams emitted from these gallium-nitride-based semiconductor lasers 530 under a divergent-light state are collimated by respectively faced collimator lenses 540. The collimated laser beams are condensed by the condensing lens 550 and converged on the incident end face of the core of the multimode optical fiber 24.

A condensing optical system is constituted by the collimator lenses 540 and the condensing lens 550 and a multiplexing optical system is constituted by the condensing optical system and the multimode optical fiber 24. That is, the laser beams condensed by a condensing lens 20 as described above enter the core of the multimode optical fiber 24 and propagate, and are multiplexed into one laser beam and emitted from the multimode optical fiber 24. When using a step-index-type fiber or a fiber having a very small core and a high NA as the multimode optical fiber 24, a grade-index-type fiber or the composite type of the grade-index type can be applied.

It is allowed to use a collimator-lens array having lens elements corresponding to the number of semiconductor lasers 530 instead of individual collimator lens 540 corresponding to each semiconductor laser 530. Also when using individual collimator lenses, it is possible to improve the space-utilization efficiency by closely arranging them and decreasing the arrangement pitch of the gallium-nitride-based lasers 530. However, by using the collimator-lens array, it is possible to further improve the effect. Moreover, when the space-utilization efficiency is improved as described above, advantages can be obtained that it is possible to increase the number of beams to be multiplexed and moreover, a comparatively large margin can be provided for the assembling-position accuracy of the gallium-nitride-based semiconductor lasers 530, a condensing optical system, and the multimode optical fiber 24.

The focal distance and numerical aperture of each lens element of a collimator-lens array or each of the collimator lenses 540 are assumed as $f_1$ and $NA_1$ the focal distance of the condensing lens 55 is assumed as $f_2$, the numerical aperture of the multimode optical fiber 24 is assumed as $NA_2$, and the space utilization efficiency is assumed as η. The space utilization efficiency η is specified by the rate of spaces occupied by optical paths of laser beams in a space used by the laser beams and a state in which optical paths are close to each other is defined as η=1.

Under the above conditions, the magnification of a lens diameter a, that is, the ratio of the beam spot diameter at each light-emitting point of a gallium-nitride-based semiconductor laser to the beam spot diameter on the core end face of the multimode optical fiber 24 is obtained from the following equation (1). An NA denotes the number of beams to be multiplexed.

$$a = \frac{f_2}{f_1} = \frac{NA_1}{\left(\frac{NA_2}{N} \times \eta\right)} = \frac{NA_1}{NA_2} \times \frac{N}{\eta} \qquad (1)$$

As clarified from the equation (1), the magnification "a" lowers as the space utilization efficiency η rises. Moreover, as the magnification "a" rises, the distance for a laser beam to move on the core end face of the multimode optical fiber 24 decreases when the relative positional relation between a gallium-nitride-based semiconductor laser, a condensing optical system, and the multimode optical fiber 24 is shifted. Therefore, even if the assembling position accuracy of the gallium-nitride-based semiconductor laser, condensing optical system, and multimode optical system 24 is comparatively loosened, it is possible to make a laser beam normally enter the core of the multimode optical system 24. Moreover, by making η approach to 1, it is possible to reduce the magnification "a" and increase the number of beams to be multiplexed N by a value equivalent to reduction of the magnification "a". Therefore, it is possible to realize a high output while keeping a large positional-shift allowance even if the number of beams to be multiplexed N is increased.

Fibers 24 set to the semiconductor laser chips 520 one each so as to emit a linear laser beam extending in the longitudinal direction of a long light-modulation-array device 402 to the device 402 arranged like an array along the longitudinal direction of the device 402.

As described above, laser beams emitted from the gallium-nitride-based semiconductor lasers 530 are collimated by respectively corresponding collimator lenses 540 and then supplied to the optical fibers 24. When each semiconductor laser chip 520 is provided with seven semiconductor lasers 530, seven collimated laser beams are optically coupled with the fibers 24 by the aspherical glass-molded lens 550. By using 100 fibers having a core diameter of 25 μm, an NA of 0.3, and an output of 0.5 W, linear ultra-high output beams of 50 W (=0.5 W×100 fibers) are emitted from the linearly arranged fibers. The linear beams are emitted from an emission lens system and supplied to a long light-modulation-array device 402.

Figure 24A:
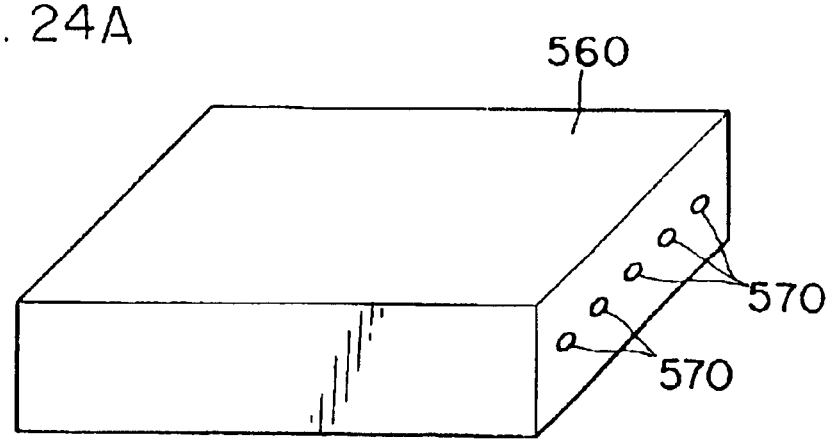
FIGS. 24A and 24B are perspective views showing a configuration of another light source used for the fourth embodiment of the invention.
Figure 24B:
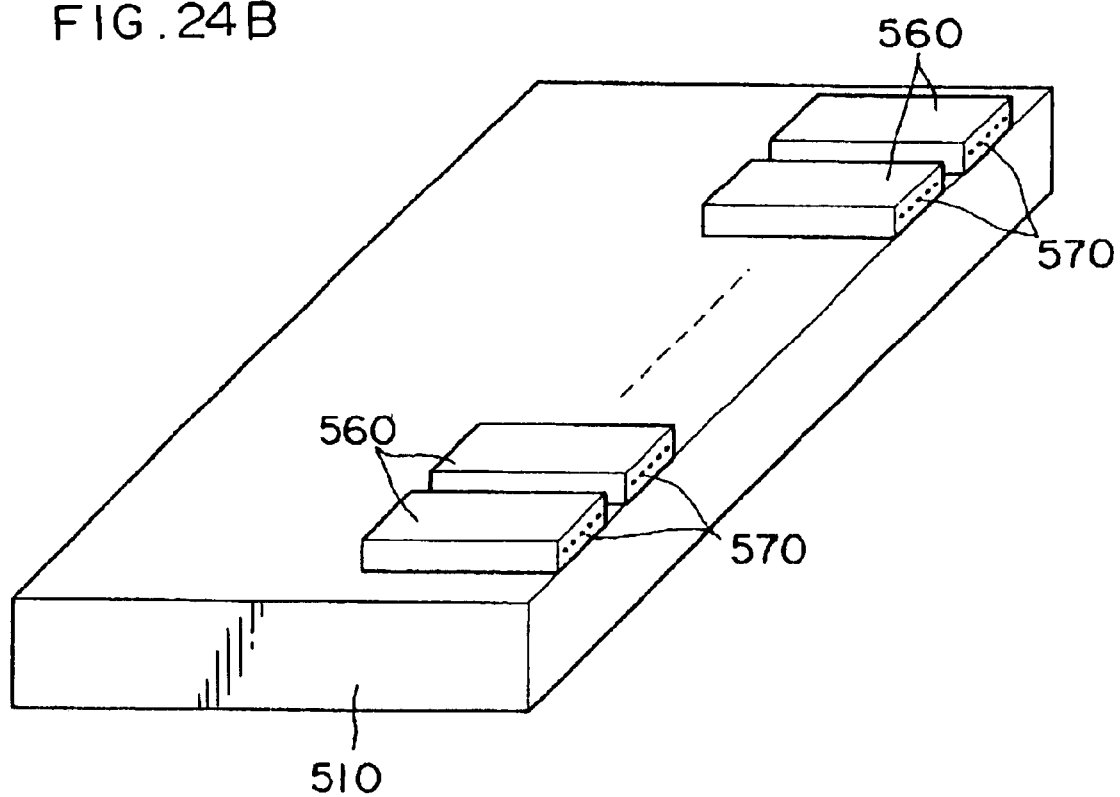

It is also allowed to use an array-type semiconductor laser constituted by arranging the semiconductor laser chips 560 shown in FIG. 24A along a predetermined direction as shown in FIG. 24B instead of using the above linear high-output beams of 50 W (=0.5 W×100 fibers). The light source 22 is constituted by a plurality of semiconductor laser chips 560. Each semiconductor laser chip 560 has a plurality of light-emitting points 570. When the output of each light-emitting point 570 is 0.1 W and the number of light-emitting points is 5, the output of each semiconductor laser chip 560 is 0.5 W (=0.1×5 chips). When the light source 22 is constituted by 34 semiconductor laser chips 560, it is possible to emit a high output of 17 W (=0.5 W×34). By arranging three devices of the 17 W array beams, a high-output beam at the 50 W (17 W×3 devices) class is obtained similarly to the case of beams obtained by arranging fibers.

As shown in FIG. 20, the exposure unit 18B linearly applies a linear light beam 14 incoming from the above light source 22 through the linearly-arranged fibers 24 onto the light-modulation-device array 402 with lenses 400 and 401 and linearly focuses a beam modulated every pixel in accordance with image data by the light-modulation-device array 402 on the surface of a powdered body with lenses 403 and 404 in the Y-axis direction through a reflection mirror 406.

Then, by referring to FIG. 25 and FIGS. 26A and 26B, the configuration and operation principle of a GL device used as a light-modulation array device are described below. A GL device 201 is a spatial light modulator (SLM) of the MEMS (Micro Electro Mechanical Systems) type as disclosed in the U.S. Pat. No. 5,311,360, which is constituted by arranging a plurality of gratings in one direction as shown in FIG. 25.

Figure 25:
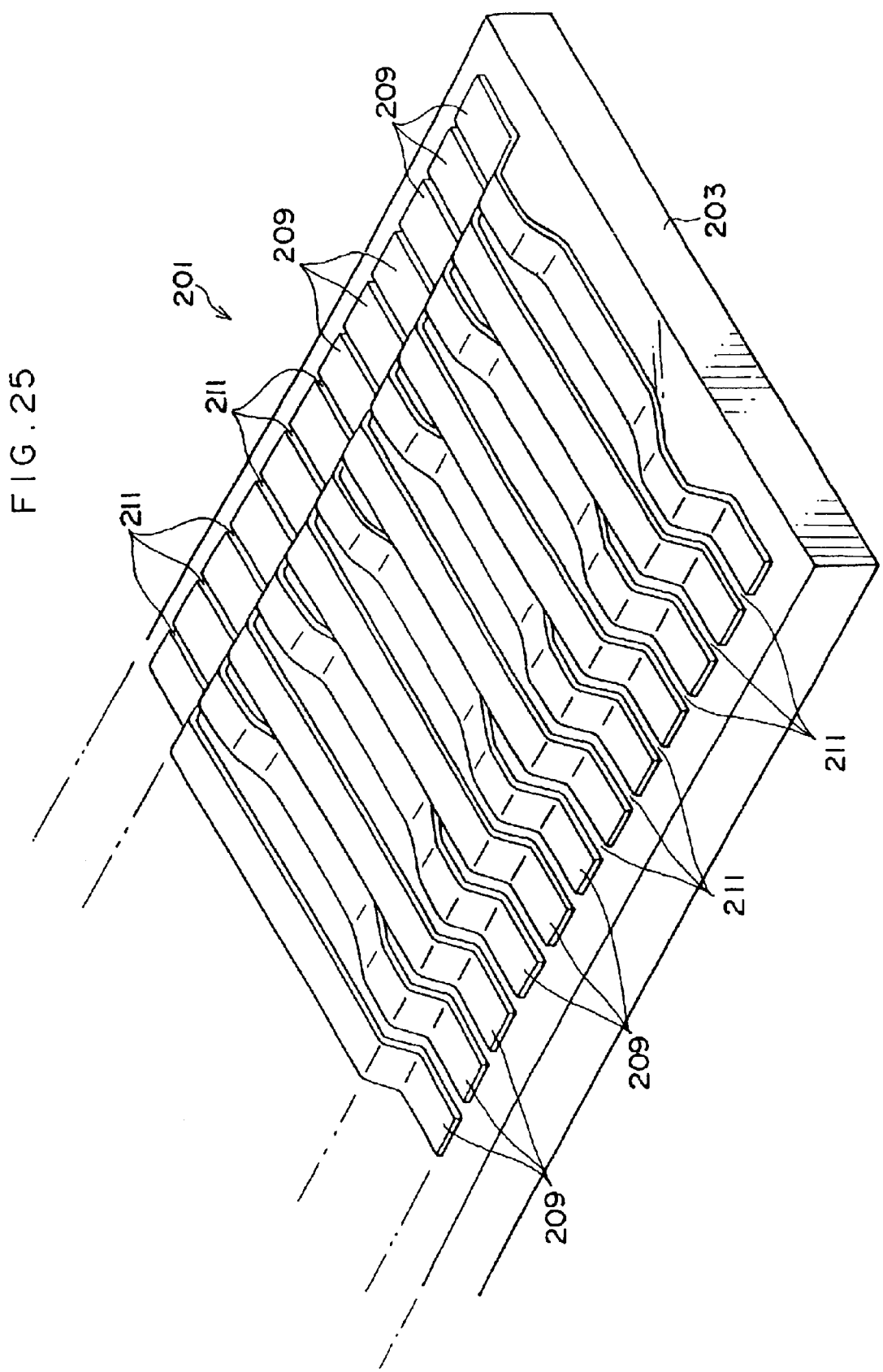
FIG. 25 is a perspective view showing a schematic configuration of a grating-light valve device (GL device) used as a light-modulation-array device.

As shown in FIG. 25, a plurality of ribbonlike microbridges 209 (e.g. 6,480 microbridges) serving as movable grating are arranged on a substrate 203 made of silicon or the like of the GL device 201. A plurality of slits 211 is formed by arranging the microbridges 209 in parallel. The microbridges 209 are separated from the substrate 203 by a predetermined interval.

As shown in FIGS. 26A and 26B, the lower side of each microbridge 209 facing the substrate 203 is constituted by a flexible beam 209a made of SiNx or the like and the surface side of it is constituted by a reflection electrode film 209b made of a single-layer metallic film of aluminum (or gold, silver, or copper). By forming the reflection electrode film 209b by gold, silver, or copper, it is possible to further improve the reflectance in accordance with the wavelength of the light used. The above substrate 203, microbridges 209, and a not-illustrated controller respectively correspond to a movable-grating-moving component.

The GL device 201 is controlled in accordance with on/off of a voltage applied between the microbridges 209 and the substrate 203. When turning on the voltage applied between the microbridges 209 and the substrate 203, an electrostatic attraction is generated between the microbridges 209 and the substrate 203 due to electrostatically induced electric charges and the microbridges 209 are deflected toward the substrate 203. Then, by turning off the applied voltage, the deflection disappears and the microbridges 209 separate from the substrate 203 due to elastic recovery. In general, one pixel is constituted by a plurality of microbridges 209 (e.g. six microbridges) and a diffraction grating is generated by alternately arranging the microbridges 209 to which a voltage will be applied when the voltage is applied to modulate light.

When no voltage is applied to the microbridges 209, all heights of reflection faces of the microbridges 209 are equalized and light is regularly reflected without causing an optical-path difference in reflected light. However, when applying a voltage to the microbridges 209 every other one, the central portion of each microbridge 209 is deflected in accordance with the above principle and reflection faces alternately having a step are formed. When applying a laser beam to the reflection faces, an optical-path difference occurs in the light reflected from the not-deflected microbridges 209 and light diffraction occurs. An intensity $I_{1st}$ of primary diffracted light depends on an optical-path difference and it can be shown by the following equation.

$$I_{1st} = I_{max} \sin\left(\frac{2\pi d}{\lambda}\right) \tag{2}$$

Then, operations of the above optical forming apparatus are described below. An XY-positioning mechanism 20 is driven by a controller (not illustrated), the exposure unit 18B is moved in the X and Y directions, and thereby, an initial position of the exposure unit 18B in the X- and Y-directions is decided. When the initial position of the exposure unit 18B is decided, a light beam is emitted from the light source 22 in a predetermined wavelength region including ultraviolet and the image data for a line segment 16B corresponding to a plurality of pixels according to the initial position of the exposure unit 18B is transmitted to a controller (not illustrated) of the light-modulation-device array 402. Each GL device of the light-modulation-device array 402 is turned on/off in accordance with the received image data as described above.

The light beam 14 emitted from the light source 22 in the predetermined wavelength region including ultraviolet is linearly applied onto the light-modulation-device array 402 through the optical fibers 24 linearly arranged in parallel with a light-modulation-array device and the lenses 400 and 401 and the beam modulated every pixel in accordance with image data by the light-modulation-device array 402 is linearly focused on the surface of a powdered body by the lenses 403 and 404 through the reflection mirror 406 in the Y-axis direction. Thereby, the line segment 16B on the surface of the powdered body is simultaneously exposed by the linear light beam 14 and an exposed portion is sintered and cured.

When exposure of the line segment 16B is completed at the initial position, the exposure unit 18B is moved by one step in the X direction by the XY-positioning mechanism 20 and the next line segment is exposed. Movement in the X direction and exposure are repeated and a region having a predetermined area of a powdered body is exposed.

For example, when assuming the spot diameter (resolution) of a light beam as 50 m on the surface of a powdered body and using the exposure unit 18B provided with the light-modulation-device array 402 corresponding to 1,000 pixels, it is possible to simultaneously expose the line segment 16B having a length of 50 mm. In this case, by exposing the line segment 16B while moving the position of the exposure unit 18B, it is possible to expose the entire surface without deteriorating the resolution.

As described above, in the case of the optical forming apparatus of this embodiment, because an exposure unit is provided with a light-modulation-device array constituted by a GL device, it is possible to simultaneously expose a line segment having a predetermined length and high-speed forming can be made. Moreover, because an exposure unit can be moved by an XY-positioning mechanism, it is possible to expose the whole by dividing the whole into a plurality of parts while shifting the position of the exposure unit. Therefore, it is possible to improve a spatial resolution by limiting the number of regions to be simultaneously exposed by one exposure unit and thus, very-minute forming is realized.

Moreover, a light source in a predetermined wavelength region including ultraviolet constituted by a plurality of gallium-nitride-based semiconductor lasers and a multiplexing optical system makes it possible to obtain a high output and it can be formed at a low cost. Therefore, it is possible to reduce the whole fabrication cost of an optical forming apparatus. Particularly, as a result of comparing the above optical forming apparatus with a conventional optical forming apparatus using a gas laser such as an excimer laser, there are advantages that the former apparatus is inexpensive, easily maintained, and decreased in size.

Furthermore, as a result of curing a light source in a predetermined wavelength region including ultraviolet outside of an exposure unit and connecting the exposure unit with the light source by an optical fiber, it is possible to decrease the exposure unit in weight and decrease the load applied to an XY-positioning mechanism, and move the exposure unit at a high speed.

A light source in a predetermined wavelength region including ultraviolet can be constituted by the light source in a predetermined wavelength region including ultraviolet in any one of the above Items (1) to (6).

Figure 27:
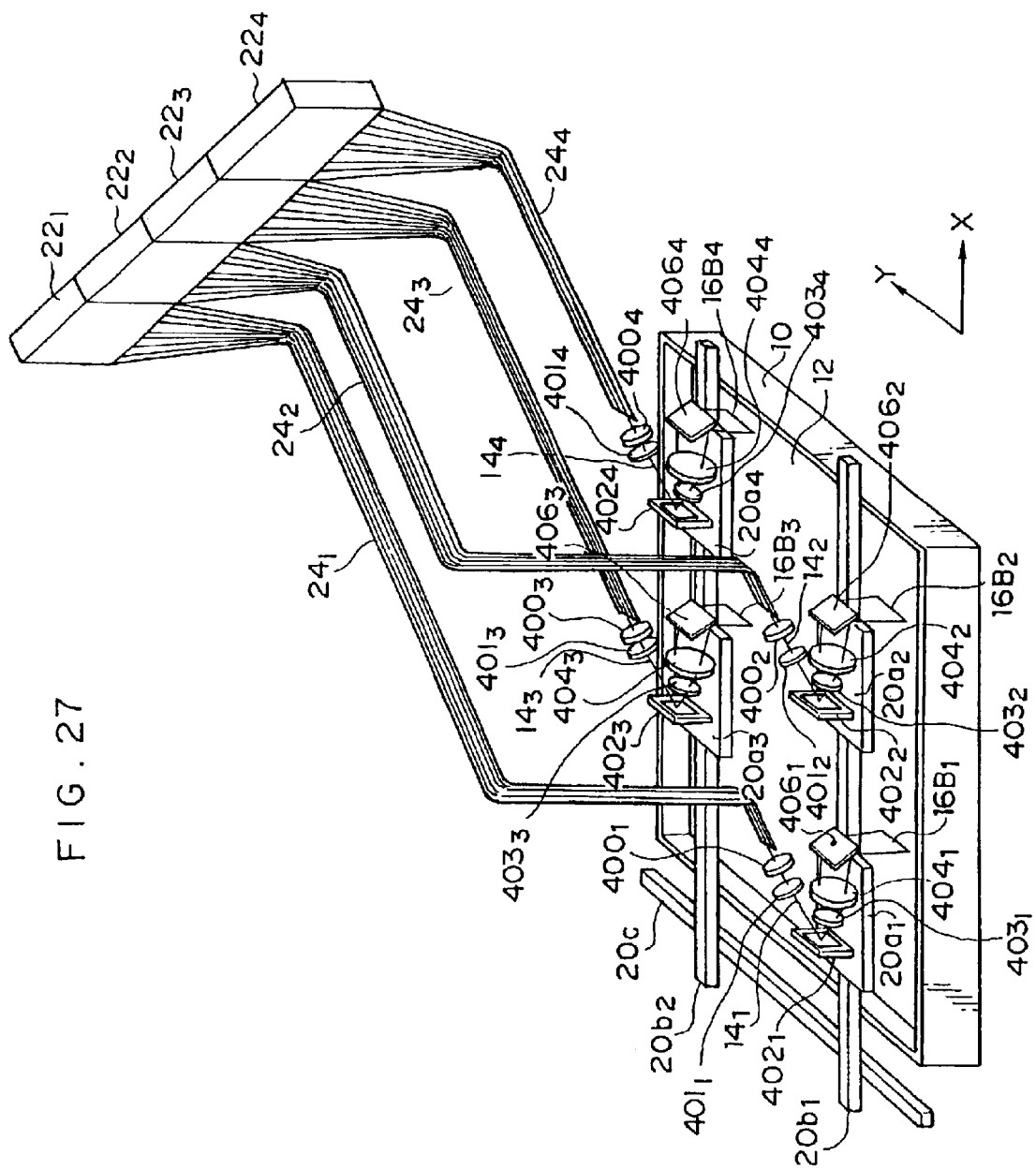
FIG. 27 is a perspective view showing a modification of the laser sintering apparatus of the fourth embodiment of the invention.

Furthermore, as shown in FIG. 27, it is possible to realize a configuration provided with a plurality of exposure units and a plurality of light sources. Because the fourth embodiment is the same as the second embodiment except that the light source 22 shown in FIG. 23 is used, the same portion is provided with the same symbol added with a suffix and its description is omitted. The optical forming apparatus has a plurality of exposure units (four units in FIG. 27) respectively provided with a light-modulation-device array and predetermined regions of the exposure units can be simultaneously exposed. Therefore, higher-speed forming can be performed. For example, when using four exposure units, forming can be performed at a speed four times higher than the case of using one exposure unit. Moreover, when performing exposure with a plurality of exposure units, it is possible to suppress occurrence of a distortion due to local curing and contract by dispersing and curing exposure regions and moreover, even if some exposure units are broken, it is possible to continue optical forming by using other normal exposure units. Therefore, the above case is superior in use stability.

The fourth embodiment described above uses a GLV as a light-modulation-array device and a fixed mirror as a mirror for reflecting a light beam passing through a condensing lens in the direction of the surface of a powdered body. However, the invention is not restricted to the above case. As shown in FIG. 5A or 5B, it is also allowed to use a DMD device constituted by arranging the micromirrors 240 by one line or up to a plurality of lines like an array.

A configuration of a light-modulation-array device is not restricted to a strict one-dimensional (that is, the number of devices of one dimension is 1) linear configuration but it is allowed to use a linear configuration in which the number of devices of one dimension is sufficiently smaller than the number of devices of the other dimension. By constituting a light-modulation-array device like a plane or a line, it is possible to simultaneously expose regions corresponding to a plurality of pixels of a powdered body and accelerate processings. However, when constituting a light-modulation-array device like a plane, a boundary between regions to be simultaneously processed constitutes a line. However, when a light-modulation-array device is constituted like a line, a boundary between regions to be simultaneously processed becomes a point. However, it is necessary to align the boundary in order to perform matching every processing. Therefore, processing becomes easy because the number of regions to be aligned when a boundary becomes a point decreases compared to a case in which a boundary becomes a line. Therefore, by constituting a light-modulation-array device like not a plane but a line, it is possible to accelerate exposure and make alignment easy.

Moreover, it is possible to make a reflection mirror rotatable toward the X-axis direction. By using this configuration and thereby, deciding the position of an exposure unit with an XY-positioning mechanism and then simultaneously exposing X-axis-directional line segments having a predetermined length in accordance with a slight rotation of the reflection mirror, it is possible to expose a predetermined region at the decided position. Thus, because a predetermined region can be exposed without moving an XY-positioning mechanism, it is possible to perform higher-speed more-minute forming.

Though the fourth embodiment uses a continuously driven gallium-nitride-based semiconductor laser as a light source, it is also allowed to use a pulse-driven gallium-nitride-based semiconductor laser. By pulse-driving a gallium-nitride-based semiconductor laser having a very-high COD level, it is possible to realize high-speed very-minute laser sintering. A shorter pulse width is better. It is preferable to set a pulse width to 1 psec to 100 nsec and more preferable to set it to 1 to 300 psec.

As shown in FIG. 23, in the case of the fourth embodiment, the fibers 24 are arranged like an array. However, the invention is not restricted to the above case. It is also allowed to arrange the fibers 24 like a bundle so as to generate a planar laser beam. In this case, it is preferable to use the light-modulation-device array 402 constituted like a plane.

For the above first, second, and fourth embodiments, a case is described in which an exposure unit is moved by an XY-positioning mechanism in the X and Y directions. However, it is also allowed to move a part cylinder in which a powdered body is set against an exposure unit.

Moreover, in the case of the above first to fourth embodiments, it is possible to properly change spot diameters and output luminous energies of a laser beam emitted from an exposure unit. For example, it is possible to perform very-minute forming by performing exposure with a low-output luminous energy or high-speed forming by performing exposure with a high-output luminous energy.

For the first and second embodiments, a case is described in which a digital micromirror device (DMD) is used as a spatial light modulator for modulating a laser beam emitted from a light source every pixel in accordance with image data. However, it is also allowed to use a grating light valve (GLV) as a spatial light modulator. Because a GLV is suitable for modulation in a line direction, it is allowed to constitute an exposure component by using a light source and a GLV array obtained by arranging GLVs in the main scanning direction. In this case, it is preferable to use a moving component such as a direct-acting positioning mechanism for relatively moving an exposure component to the surface of a powdered body or a scanning component such as a movable mirror so that the GLV array moves in a subscanning direction crossing the main scanning direction.

In the case of the first to fourth embodiments, it is possible to use engineering plastic, metal, ceramics, sand, or wax as a powdered body. In detail, it is possible to use any one of a composite material of acrylic acid and Nylon 11, beads-contained Nylon 11, synthetic rubber, stainless steel 316, stainless steel 420, zircon sand, and silica sand. However, the invention is not restricted to the above materials. It is possible to select a material suitable for a purpose.

In the case of the first to fourth embodiments, it is possible to use a continuously- or pulse-driven laser beam in a predetermined wavelength region including ultraviolet as a light source. It is preferable that a laser beam in a predetermined wavelength region including ultraviolet has a wavelength of 350 to 420 nm. A wavelength of 405 nm can be most expected for a high output in that a low-cost GaN-based semiconductor laser is used. When using a pulse-driven laser beam as a light source, it is allowed to pulse-drive a gallium-nitride-based semiconductor laser having a high COD level or pulse-drive a solid-state laser or fiber laser with a Q-switch or in accordance with mode-locking operation. By using a pulse-driven laser beam as a light source, high-speed very-minute forming is realized because thermal diffusion is prevented. Therefore, it is preferable that the pulse cycle of a pulse-driven laser beam is shorter and the pulse cycle of 1 psec to 100 nsec is suitable and the pulse cycle of 1 to 300 psec is more suitable.

For the first and second embodiments, a case is described in which one lens is set to the emission side of a DMD. However, it is also allowed to set a plurality of lenses by combining them.

What is claimed is:

1. A laser sintering apparatus for forming a three-dimensional model by exposing a powdered body with a laser beam, comprising:
   an exposure component for exposing predetermined regions corresponding to a plurality of pixels on a surface of the powdered body with a laser beam, which has a wavelength in a predetermined wavelength region that includes ultraviolet, and which is emitted from a light source and modulated for each pixel in accordance with image data; and
   a moving component for moving the exposure component relative to the surface of the powdered body.

2. The laser sintering apparatus of claim 1, wherein a plurality of the exposure components is provided so that each of the exposure components can move independently relative to the surface of the powdered body.

3. The laser sintering apparatus of claim 1, wherein the exposure component includes a light source and a spatial light modulator for modulating the laser beam, which is emitted from the light source and has a wavelength in a predetermined wavelength region that includes ultraviolet, for each pixel in accordance with image data.

4. The laser sintering apparatus of claim 3, wherein the spatial light modulator comprises a digital micromirror device.

5. The laser sintering apparatus of claim 1, wherein the exposure component includes a light source and a spatial-light-modulator array in which spatial light modulators that modulate the laser beam, which is emitted from the light source and has a wavelength in a predetermined wavelength region that includes ultraviolet, for each pixel in accordance with image data are arranged in a first scanning direction.

6. The laser sintering apparatus of claim 5, wherein the moving component moves the exposure component relative to the surface of the powdered body so that the spatial-light-modulator array moves in a second scanning direction that crosses the first scanning direction.

7. The laser sintering apparatus of claim 5, wherein the spatial light modulators serve as grating light valves.

8. The laser sintering apparatus of claim 1, wherein the light source comprises a laser beam source selected from a gallium-nitride-based semiconductor laser, a semiconductor-laser-exciting solid-state laser for emitting a laser beam obtained by exciting solid-state laser crystal with a gallium-nitride-based semiconductor laser and wavelength-converting the laser beam with a light-wavelength conversion device, a fiber laser or a fiber amplifier for emitting a laser beam obtained by exciting a fiber with a semiconductor laser that emits light in the infrared region and wavelength-converting the laser beam with a light-wavelength conversion device, and a fiber laser for emitting a laser beam obtained by exciting a fiber with a gallium-nitride-based semiconductor laser and wavelength-converting the laser beam with a light-wavelength conversion device.

9. The laser sintering apparatus of claim 1, wherein the light source comprises a laser-beam source selected from a first laser-beam source in which a gallium-nitride-based semiconductor laser is connected to fibers, a second laser-beam source in which plural gallium-nitride-based semiconductor lasers are connected to fibers by a multiplexing optical system, a linear laser-beam source in which at least either the fibers of the first laser-beam source or the fibers of the second laser-beam source are arranged like an array so that a linear laser-beam flux is emitted, and a planar laser-beam source in which at least either the fibers of the first laser-beam source or the fibers of the second laser-beam source are arranged like a bundle so that a spot-shaped laser-beam flux is emitted.

10. The laser sintering apparatus of claim 1, wherein the light source includes a plurality of laser-beam sources and a multiplexing optical system for multiplexing laser beams emitted from the laser-beam sources.

11. A laser sintering apparatus for forming a three-dimensional model by exposing a powdered body with a laser beam, comprising:
   an exposure component for exposing predetermined regions corresponding to a plurality of pixels on a surface of the powdered body with a pulse-driven laser beam, which has a wavelength in a predetermined wavelength region that includes ultraviolet, and which is emitted from a light source and modulated for each pixel in accordance with image data; and a moving component for moving the exposure component relative to the surface of the powdered body.

12. The laser sintering apparatus of claim 11, wherein a plurality of the exposure components is provided so that each of the exposure components can move independently relative to the surface of the powdered body.

13. The laser sintering apparatus of claim 11, wherein the exposure component includes a light source and a spatial light modulator for modulating the laser beam, which is emitted from the light source and has a wavelength in a predetermined wavelength region that includes ultraviolet, for each pixel in accordance with image data.

14. The laser sintering apparatus of claim 13, wherein the spatial light modulator comprises a digital micromirror device.

15. The laser sintering apparatus of claim 11, wherein the exposure component includes a light source and a spatial-light-modulator array in which spatial light modulators that modulate the laser beam, which is emitted from the light source and has a wavelength in a predetermined wavelength region that includes ultraviolet, for each pixel in accordance with image data are arranged in a first scanning direction.

16. The laser sintering apparatus of claim 15, wherein the moving component moves the exposure component relative to the surface of the powdered body so that the spatial-light-modulator array moves in a second scanning direction that crosses the first scanning direction.

17. The laser sintering apparatus of claim 15, wherein the spatial light modulators serve as grating light valves.

18. The laser sintering apparatus of claim 11, wherein the light source comprises a laser-beam source selected from a gallium-nitride-based semiconductor laser, a semiconductor-laser-exciting solid-state laser for emitting a laser beam obtained by exciting solid-state laser crystal with a gallium-nitride-based semiconductor laser and wavelength-converting the laser beam with a light-wavelength conversion device, a fiber laser or a fiber amplifier for emitting a laser beam obtained by exciting a fiber with a semiconductor laser that emits light in the infrared region and wavelength-converting the laser beam with a light-wavelength conversion device, and a fiber laser for emitting a laser beam obtained by exciting a fiber with a gallium-nitride-based semiconductor laser and wavelength-converting the laser beam with a light-wavelength conversion device.

19. The laser sintering apparatus of claim 11, wherein the light source comprises a laser-beam source selected from a first laser-beam source in which a gallium-nitride-based semiconductor laser is connected to fibers, a second laser-beam source in which plural gallium-nitride-based semiconductor lasers are connected to fibers by a multiplexing optical system, a linear laser-beam source in which at least either the fibers of the first laser-beam source or the fibers of the second laser-beam source are arranged like an array so that a linear laser-beam flux is emitted, and a planar laser-beam source in which at least either the fibers of the first laser-beam source or the fibers of the second laser-beam source are arranged like a bundle so that a spot-shaped laser beam flux is emitted.

20. The laser sintering apparatus of claim 11, wherein the light source includes a plurality of laser-beam sources and a multiplexing optical system for multiplexing laser beams emitted from the laser beam sources.

21. A laser sintering apparatus for forming a three-dimensional model by exposing a powdered body with a laser beam, comprising:

an exposure component provided with a scanning function for scanning and exposing predetermined regions corresponding to a plurality of pixels on a surface of the powdered body with a laser beam, which has a wavelength in a predetermined wavelength region that includes ultraviolet, and which is emitted from a light source and modulated for each pixel in accordance with image data; and a moving component for moving the exposure component relative to the surface of the powdered body.

22. The laser sintering apparatus of claim 21, wherein a plurality of the exposure components is provided so that each of the exposure components can move independently relative to the surface of the powdered body.

23. The laser sintering apparatus of claim 21, wherein a plurality of the exposure components is provided so that each of the exposure components can independently scan the surface of the powdered body.

24. The laser sintering apparatus of claim 21, wherein the exposure component includes a light source and a spatial light modulator for modulating the laser beam, which is emitted from the light source and has a wavelength in a predetermined wavelength region that includes ultraviolet, for each pixel in accordance with image data.

25. The laser sintering apparatus of claim 24, wherein the spatial light modulator comprises a digital micromirror device.

26. The laser sintering apparatus of claim 21, wherein the exposure component includes a light source and a spatial-light-modulator array in which spatial light modulators that modulate the laser beam, which is emitted from the light source and has a wavelength in a predetermined wavelength region that includes ultraviolet, for each pixel in accordance with image data are arranged in a first scanning direction.

27. The laser sintering apparatus of claim 26, wherein the moving component moves the exposure component relative to the surface of the powdered body so that the spatial-light-modulator array moves in a second scanning direction that crosses the first scanning direction.

28. The laser sintering apparatus of claim 26, wherein the spatial light modulators serve as grating light valves.

29. The laser sintering apparatus of claim 21, wherein the light source comprises a laser-beam source selected from a gallium-nitride-based semiconductor laser, a semiconductor-laser-exciting solid-state laser for emitting a laser beam obtained by exciting solid-state laser crystal with a gallium-nitride-based semiconductor laser and wavelength-converting the laser beam with a light-wavelength conversion device, a fiber laser or a fiber amplifier for emitting a laser beam obtained by exciting a fiber with a semiconductor laser that emits light in the infrared region and wavelength-converting the laser beam with a light-wavelength conversion device, and a fiber laser for emitting a laser beam obtained by exciting a fiber with a gallium-nitride-based semiconductor laser and wavelength-converting the laser beam with a light-wavelength conversion device.

30. The laser sintering apparatus of claim 21, wherein the light source comprises a laser-beam source selected from a first laser-beam source in which a gallium-nitride-based semiconductor laser is connected to fibers, a second laser-beam source in which plural gallium-nitride-based semiconductor lasers are connected to fibers by a multiplexing optical system, a linear laser-beam source in which at least either the fibers of the first laser-beam source or the fibers of the second laser-beam source are arranged like an array so that a linear laser-beam flux is emitted, and a planar laser-beam source in which at least either the fibers of the first laser-beam source or the fibers of the second laser-beam source are arranged like a bundle so that a spot-shaped laser beam flux is emitted.

31. The laser sintering apparatus of claim 21, wherein the light source includes a plurality of laser-beam sources and a multiplexing optical system for multiplexing laser beams emitted from the laser-beam sources.

* * * * *